US011145714B2

(12) United States Patent
Takaoka

(10) Patent No.: US 11,145,714 B2
(45) Date of Patent: Oct. 12, 2021

(54) SEMICONDUCTOR DEVICE

(71) Applicant: ROHM CO., LTD., Kyoto (JP)

(72) Inventor: Jun Takaoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/428,369

(22) Filed: May 31, 2019

(65) Prior Publication Data

US 2019/0288062 A1 Sep. 19, 2019

Related U.S. Application Data

(63) Continuation of application No. 15/808,146, filed on Nov. 9, 2017, now Pat. No. 10,347,714.

(30) Foreign Application Priority Data

Nov. 10, 2016 (JP) ............................ JP2016-219800
Oct. 18, 2017 (JP) ............................ JP2017-202112

(51) Int. Cl.
*H01L 23/00* (2006.01)
*H01L 21/66* (2006.01)
(Continued)

(52) U.S. Cl.
CPC ...... *H01L 29/0634* (2013.01); *H01L 27/0629* (2013.01); *H01L 27/0635* (2013.01);
(Continued)

(58) Field of Classification Search
None
See application file for complete search history.

(56) References Cited

U.S. PATENT DOCUMENTS 4,742,377 A * 5/1988 Einthoven ............. H01L 29/872 257/484
5,747,853 A * 5/1998 So ....................... H01L 29/0626 257/355
(Continued)

FOREIGN PATENT DOCUMENTS

JP H10335679 12/1998
JP 2003158258 5/2003
(Continued)

OTHER PUBLICATIONS

Decision to Grant a Patent issued for Japanese Patent Application No. 2017-202112, dated Nov. 28, 2019, 5 pages including English machine translation.
Office Action issued for Japanese Patent Application No. 2017-202112, dated Sep. 19, 2019, 20 pages including English machine translation.

*Primary Examiner* — Zandra V Smith
*Assistant Examiner* — Lawrence C Tynes, Jr.
(74) *Attorney, Agent, or Firm* — Hamre, Schumann, Mueller & Larson, P.C

(57) ABSTRACT

A semiconductor device includes a semiconductor layer of a first conductivity type, an impurity region of a second conductivity type formed in a surface layer portion of the semiconductor layer, a terminal region of the second conductivity type that is formed in the surface layer portion of the semiconductor layer along a peripheral edge of the impurity region and that has a second conductivity type impurity concentration higher than a second conductivity type impurity concentration of the impurity region, and a surface electrode that is formed on the semiconductor layer and that has a connection portion connected to the impurity region and to the terminal region.

18 Claims, 17 Drawing Sheets

(51) Int. Cl.

| | |
|---|---|
| ***H01L 21/768*** | (2006.01) |
| ***H01L 29/06*** | (2006.01) |
| ***H01L 29/861*** | (2006.01) |
| ***H01L 29/78*** | (2006.01) |
| ***H01L 29/739*** | (2006.01) |
| ***H01L 29/40*** | (2006.01) |
| ***H01L 29/10*** | (2006.01) |
| ***H01L 29/08*** | (2006.01) |
| ***H01L 27/06*** | (2006.01) |
| ***H01L 29/423*** | (2006.01) |
| *H01L 29/36* | (2006.01) |

(52) U.S. Cl.

CPC ...... *H01L 29/0615* (2013.01); *H01L 29/0619* (2013.01); *H01L 29/0649* (2013.01); *H01L 29/0804* (2013.01); *H01L 29/0821* (2013.01); *H01L 29/0865* (2013.01); *H01L 29/0882* (2013.01); *H01L 29/1095* (2013.01); *H01L 29/404* (2013.01); *H01L 29/4236* (2013.01); *H01L 29/7395* (2013.01); *H01L 29/7397* (2013.01); *H01L 29/7804* (2013.01); *H01L 29/7811* (2013.01); *H01L 29/7813* (2013.01); *H01L 29/861* (2013.01); *H01L 29/8611* (2013.01); *H01L 29/0638* (2013.01); *H01L 29/36* (2013.01)

(56) References Cited

U.S. PATENT DOCUMENTS

| | | | | |
|---|---|---|---|---|
| 5,804,868 | A * | 9/1998 | Kobayashi | H01L 29/408 257/630 |
| 6,175,143 | B1 * | 1/2001 | Fujihira | H01L 29/0692 257/471 |
| 2001/0005031 | A1 * | 6/2001 | Sakamoto | H01L 29/7722 257/401 |
| 2012/0068310 | A1 * | 3/2012 | Uemura | H01L 23/58 257/577 |
| 2013/0214394 | A1 * | 8/2013 | Senoo | H01L 29/7395 257/629 |
| 2015/0340356 | A1 * | 11/2015 | Naito | H01L 29/861 257/49 |
| 2016/0260830 | A1 * | 9/2016 | Nakano | H01L 29/0649 |
| 2016/0284834 | A1 | 9/2016 | Shimizu et al. | |

FOREIGN PATENT DOCUMENTS

| | | |
|---|---|---|
| JP | 2009038213 | 2/2009 |
| JP | 2012199434 | 10/2012 |
| JP | 2014099444 | 5/2014 |
| JP | 2014127573 | 7/2014 |
| JP | 2014241367 | 12/2014 |
| WO | 2013153668 | 10/2013 |
| WO | 2016114138 | 7/2016 |

* cited by examiner 2
(10)
p
3
42
13
14a
16
17
15
24
III
14
p+
31
32
36
21
4
W1
33
25
p+
18A
43
W2
33
25
p+
18B
W3
33
25
p+
18C
W4
18
33
25
p+
18D
7
1
12
37
11
n-
n+
L
41
21
34
26
19
n+
5
8
6

III
3
2
(10)
31
42
41
Di
p
n⁻
13
12
6
14a
17
16
15
S1
32
35
35a
7
24
p⁺
22
21
23
14
36

III
31
24
42
S2
41
46
21
22
23
36
3
2
(10)
35
Di
35a
13
12
n⁻
p
6
14a
17
15
45
7
p⁺
14

Connection size S1
Connection size S2
8000
P1
Current density[A/cm2]
P2
P3
1600
1300
-60
-30
0
10
Size [um]

III
31
24
42
S3
41
52(22)
21
22
23
36
2
(10)
35
Di
35a
p
13
n−
12
16
6
14a
17
15
51
7
p+
14

Gate
Gate
21
63
21
Emitter
64
3
57
n+
n+
p+
n+
n+
57
13
p
p
p
13
57
58
13
57
60
61
62
59
60
61
62
59
2
(10)
12
n−
56
p+
65
4
Collector
55

Gate
Gate
72
72
61
62
21
63
21
62
61
Emitter
64
3
57
n+
n+
p+
n+
n+
57
13
p
p
p
13
57
58
13
57
2
(10)
12
n−
56
p+
65
4
Collector
71

31
32
33
34
2
3
4
5
XIII
XIII
8
7
6
7
8
101

101
2
(10)
3
42
41
13
4
43
6
7
XIV
XV
XVI
XVII
24
31
32
36
14
21
18A
18B
18C
18D
18E
18F
18G
18H
18 I
18J
18
33
25
n⁻
n⁺
12
11
37
L
34
26
19
114
5

25
33
112
25
33
111
36
41
S1
XIV
35
32
31
3
p+
p+
p+
p−
16
p
13
Di
15
17
2
(10)
p
p
p
18B
18A
14
n−
12
21
25
22
23
106
105
p+
18A
107
33
21
24
22
23
103
102
14
104
p+
32
35a 41
32
2
(10)
22
23
21
14
111
33
25
XV
W1
W2
W3
W4
W5
W6
W7
W8
W9
W10
18A
18B
18C
18D
18E
18F
18G
18H
18I
18J
112
37
3
12

XVI
41
112
107
25
105
106
33
37
112
3
23
22
21
2
(10)
12
$p^+$
p
$n^-$
18J

XVII
41
3
23
22
21
2
(10)
113
34
109
26
108
113
110
n+
n
n-
19
114
5

SEMICONDUCTOR DEVICE

BACKGROUND OF THE INVENTION

1. Field of the Invention

The present invention relates to a semiconductor device.

2. Description of the Related Art

JP2003-158258 discloses a semiconductor device. This semiconductor device includes an n type semiconductor layer. A p-type collector region (impurity region) is formed in a surface layer portion of the semiconductor layer. A p-type well layer (terminal region) is formed in the surface layer portion of the semiconductor layer so as to be connected to the collector region. An emitter electrode (surface electrode) is formed on the semiconductor layer so as to be connected to the collector region.

SUMMARY OF THE INVENTION

A preferred embodiment of the present invention provides a semiconductor device that includes a semiconductor layer of a first conductivity type, an impurity region of a second conductivity type formed in a surface layer portion of the semiconductor layer, a terminal region of the second conductivity type that is formed in the surface layer portion of the semiconductor layer along a peripheral edge of the impurity region and that has a second conductivity type impurity concentration higher than a second conductivity type impurity concentration of the impurity region, and a surface electrode that is formed on the semiconductor layer and that has a connection portion connected to the impurity region and to the terminal region.

A preferred embodiment of the present invention provides a semiconductor device that includes a semiconductor layer of a first conductivity type, an impurity region of a second conductivity type formed in a surface layer portion of the semiconductor layer, a terminal region of the second conductivity type that is formed in the surface layer portion of the semiconductor layer along a peripheral edge of the impurity region and that has a second conductivity type impurity concentration higher than a second conductivity type impurity concentration of the impurity region, a concentration reducing region of the second conductivity type that is formed in a boundary region between the impurity region and the terminal region and that reduces a concentration difference between the second conductivity type impurity concentration of the impurity region and the second conductivity type impurity concentration of the terminal region, and a surface electrode that is formed on the semiconductor layer and that is connected to the impurity region.

The aforementioned or still other objects, features, and effects of the present invention will be clarified by the following description of preferred embodiments given below with reference to the accompanying drawings.

DETAILED DESCRIPTION OF THE PREFERRED EMBODIMENTS

Figure 1:
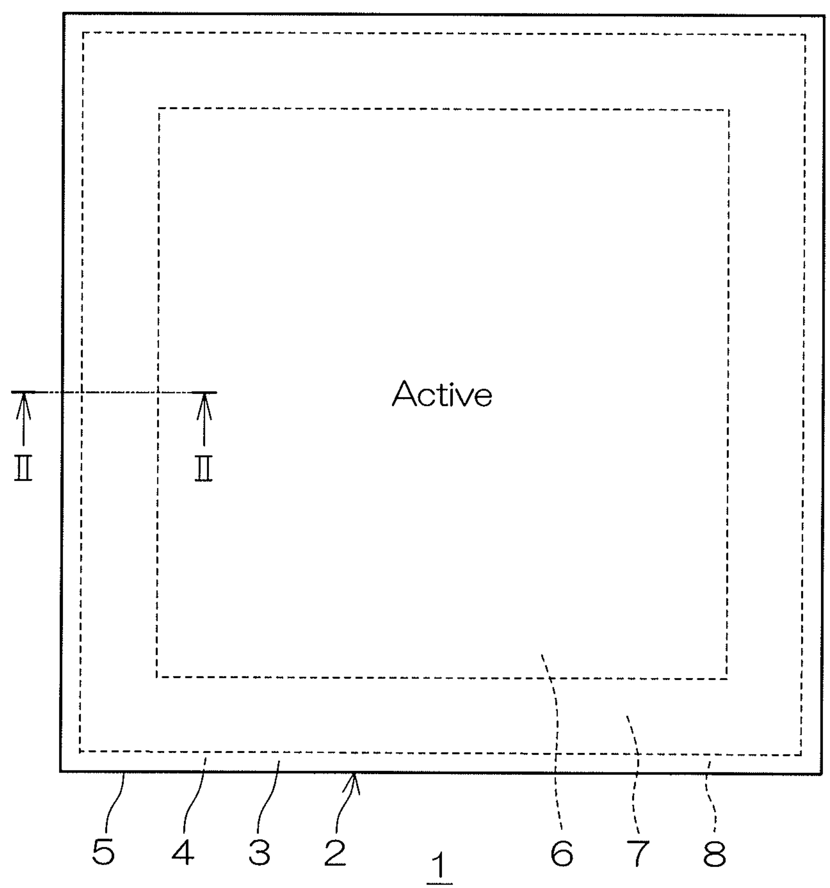
FIG. 1 is a schematic plan view of a semiconductor device according to a first preferred embodiment of the present invention.

The semiconductor device according to JP2003-158258 has a structure in which the surface electrode is connected only to the impurity region. Therefore, when the semiconductor device performs an on-off operation, an electric current flowing through the terminal region flows into the surface electrode through the impurity region.

Therefore, there is a possibility that current density will rise rapidly in a region in which the electric current flowing through the terminal region and the electric current flowing through the impurity region join together. As a result, there is a possibility that the temperature in the vicinity of the surface electrode or of the impurity region will rise rapidly, and a semiconductor layer may be broken. These problems constitute a factor of a fall in breakdown tolerance of the semiconductor device.

Therefore, a preferred embodiment of the present invention provides a semiconductor device that is capable of improving the breakdown tolerance.

A preferred embodiment of the present invention provides a semiconductor device that includes a semiconductor layer of a first conductivity type, an impurity region of a second conductivity type formed in a surface layer portion of the semiconductor layer, a terminal region of the second conductivity type that is formed in the surface layer portion of the semiconductor layer along a peripheral edge of the impurity region and that has a second conductivity type impurity concentration higher than a second conductivity type impurity concentration of the impurity region, and a surface electrode that is formed on the semiconductor layer and that has a connection portion connected to the impurity region and to the terminal region.

According to this semiconductor device, the surface electrode has the connection portion that crosses the boundary between the impurity region and the terminal region and that is connected to the terminal region, in addition to the impurity region. Therefore, when the semiconductor device performs an on-off operation, it is possible to allow an electric current to directly flow from the impurity region into the surface electrode, and it is possible to allow an electric current to directly flow from the terminal region into the surface electrode.

This makes it possible to restrain an increase in current density and a rise in temperature in a region in which an electric current flowing through the terminal region and an electric current flowing through the impurity region join together. As a result, it is possible to provide a semiconductor device capable of improving the breakdown tolerance.

A preferred embodiment of the present invention provides a semiconductor device that includes a semiconductor layer of a first conductivity type, an impurity region of a second conductivity type formed in a surface layer portion of the semiconductor layer, a terminal region of the second conductivity type that is formed in the surface layer portion of the semiconductor layer along a peripheral edge of the impurity region and that has a second conductivity type impurity concentration higher than a second conductivity type impurity concentration of the impurity region, a concentration reducing region of the second conductivity type that is formed in a boundary region between the impurity region and the terminal region and that reduces a concentration difference between the second conductivity type impurity concentration of the impurity region and the second conductivity type impurity concentration of the terminal region, and a surface electrode that is formed on the semiconductor layer and that is connected to the impurity region.

According to this semiconductor device, the concentration reducing region of the second conductivity type is formed in the boundary region between the impurity region and the terminal region. The concentration reducing region of the second conductivity type reduces the concentration difference between the second conductivity type impurity concentration of the impurity region and the second conductivity type impurity concentration of the terminal region.

If a concentration difference between the second conductivity type impurity concentration of the impurity region and the second conductivity type impurity concentration of the terminal region is large, the current density of an electric current flowing through the terminal region becomes higher than the current density of an electric current flowing through the impurity region. Therefore, when the semiconductor device performs an on-off operation, the current density rises in the boundary region in which an electric current flowing through the terminal region and an electric current flowing through the impurity region join together.

Therefore, the formation of the concentration reducing region in the boundary region between the impurity region and the terminal region makes it possible to restrain an increase in current density and a rise in temperature in the boundary region. As a result, it is possible to provide a semiconductor device capable of improving the breakdown tolerance.

Preferred embodiments of the present invention will be hereinafter described in detail with reference to the accompanying drawings.

FIG. 1 is a schematic plan view of a semiconductor device 1 according to a first preferred embodiment of the present invention.

The semiconductor device 1 is a diode device that includes a pn junction diode as a semiconductor element. Referring to FIG. 1, the semiconductor device 1 includes a semiconductor layer 2 formed in a chip-shape. The semiconductor layer 2 includes a first principal surface 3 on one side, a second principal surface 4 on the other side, and a side surface 5 by which the first principal surface 3 and the second principal surface 4 are connected together.

The semiconductor layer 2 is formed in a quadrangular shape in a plan view as viewed from the normal direction of the first principal surface 3 (hereinafter, referred to simply as "in the plan view"). The length of one side of the semiconductor layer 2 may be 5 mm or more and 20 mm or less.

The semiconductor layer 2 includes an device formation region 6, an outer region 7, and a scribe region 8. The device formation region 6 is a region in which a pn junction diode is formed. The device formation region 6 is also called an active region. The outer region 7 is a region outside the device formation region 6. The scribe region 8 is a region outside the outer region 7.

The device formation region 6 may be set to have a quadrangular shape having four sides respectively parallel to the sides of the semiconductor layer 2 in the plan view. The device formation region 6 is set to have an interval from a peripheral edge of the semiconductor layer 2 inside the semiconductor layer 2.

The outer region 7 may be set to become endless (for example, in a quadrangular annular shape) so as to surround the device formation region 6 in the plan view. The scribe region 8 may be set to become endless (for example, in a quadrangular annular shape) so as to surround the outer region 7 in the plan view.

Figure 2:
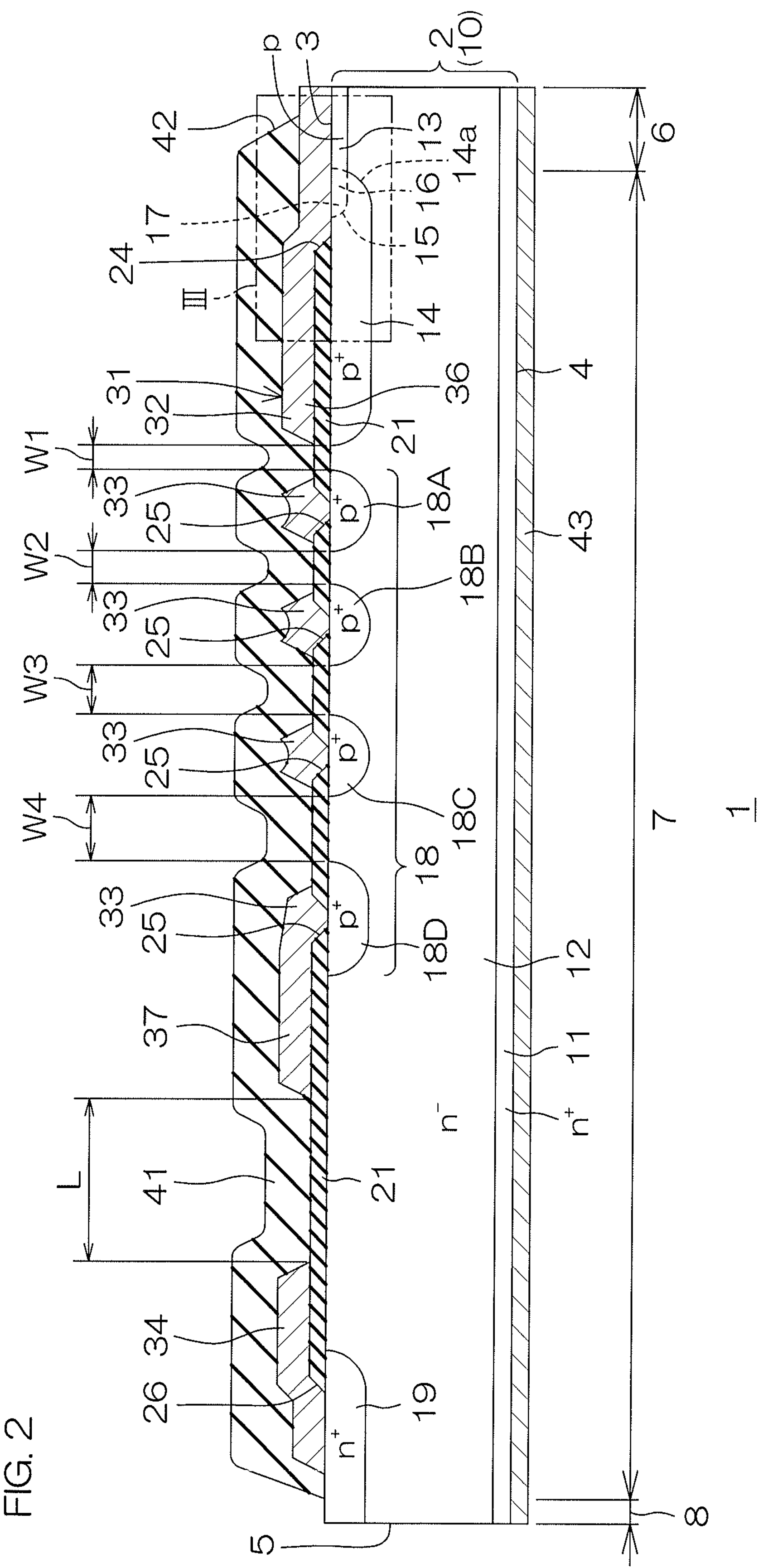
FIG. 2 is a cross-sectional view along line II-II of FIG. 1.
Figure 3:
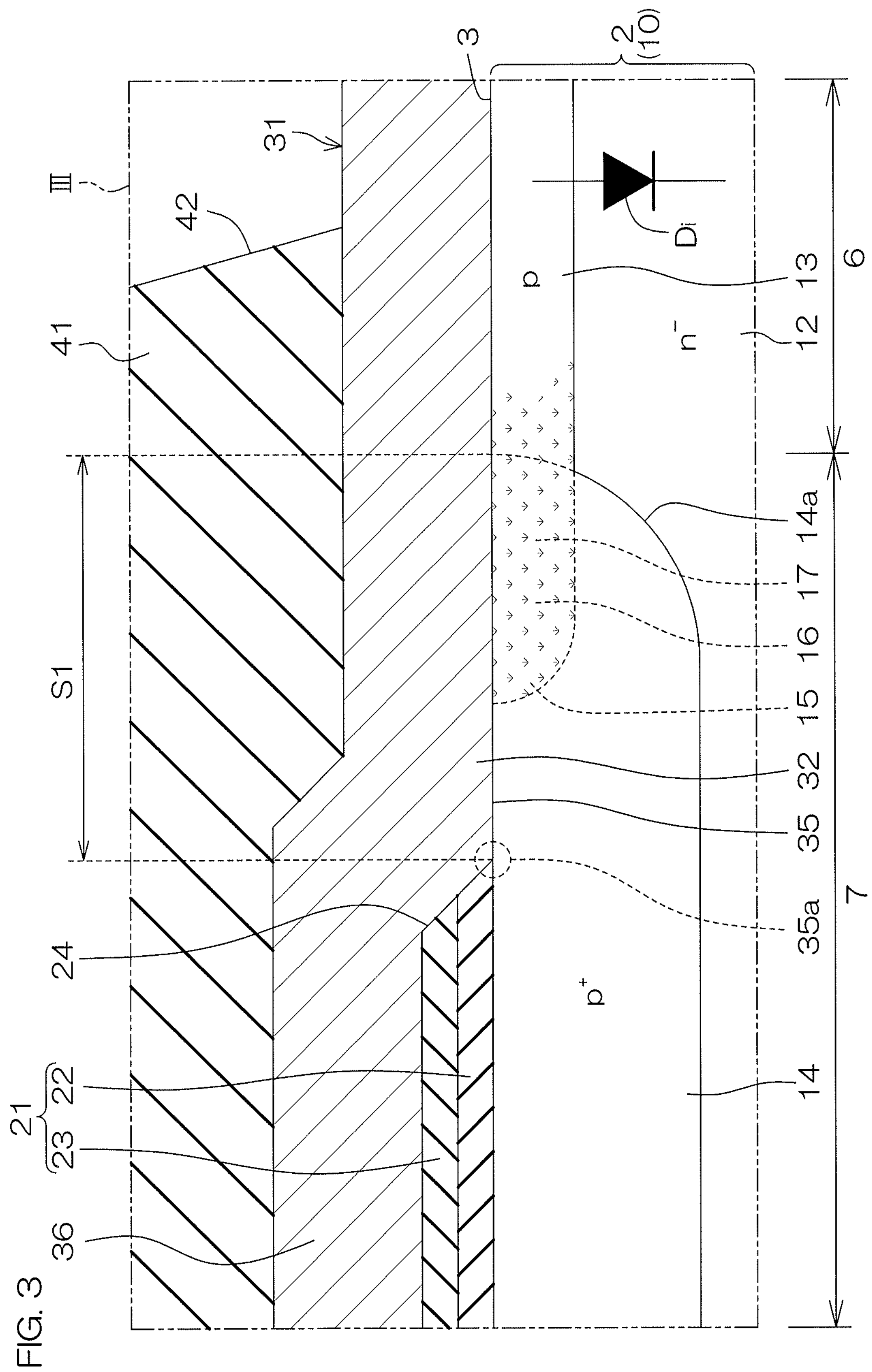
FIG. 3 is an enlarged view of region III of FIG. 2.

FIG. 2 is a cross-sectional view along line II-II of FIG. 1. FIG. 3 is an enlarged view of region III of FIG. 2.

Referring to FIG. 2, the semiconductor layer 2 has a single-layer structure including an $n^-$-type semiconductor substrate 10. The $n^-$-type semiconductor substrate 10 may be an FZ substrate made of silicon formed according to an FZ (Floating Zone) method.

An $n^+$-type highly-concentrated region 11 is formed in a surface layer portion of the second principal surface 4 of the semiconductor layer 2. In the semiconductor layer 2, an $n^-$-type region outside the $n^+$-type highly-concentrated region 11 is formed as an $n^-$-type drift region 12.

The semiconductor layer 2 may have a layered structure including an $n^+$-type semiconductor substrate and an $n^-$-type epitaxial layer, instead of the single-layer structure of the $n^-$-type semiconductor substrate 10. The $n^+$-type semiconductor substrate may be made of silicon. The $n^-$-type epitaxial layer may be formed by epitaxially growing silicon from the principal surface of the $n^+$-type semiconductor substrate.

In the thus formed structure, the $n^+$-type semiconductor substrate is equivalent to the $n^+$-type highly-concentrated region 11, and the $n^-$-type epitaxial layer is equivalent to the $n^-$-type drift region 12.

In the device formation region 6, a p-type impurity region 13 is formed in a surface layer portion of the first principal surface 3 of the semiconductor layer 2. The p-type impurity region 13 may be formed in a quadrangular shape having four sides respectively parallel to the sides of the semiconductor layer 2 in the plan view.

The p-type impurity region 13 forms a pn junction portion between the semiconductor layer 2 and the p-type impurity region 13. A pn junction diode Di, in which the p-type impurity region 13 serves as an anode whereas the semiconductor layer 2 serves as a cathode, is formed by the pn junction portion. The pn junction diode Di may be a fast-recovery diode.

In the outer region 7, a $p^+$-type terminal region 14 is formed in the surface layer portion of the first principal surface 3 of the semiconductor layer 2. The $p^+$-type terminal region 14 has a p-type impurity concentration higher than that of the p-type impurity region 13. The $p^+$-type terminal region 14 is formed as a region that is higher in concentration and that is lower in resistance than the p-type impurity region 13.

The $p^+$-type terminal region 14 is formed in a belt shape extending along a peripheral edge of the p-type impurity region 13 in the plan view. The $p^+$-type terminal region 14 is formed in an endless shape (for example, in a quadrangular annular shape) so as to surround the p-type impurity region 13 in the plan view. The device formation region 6 is defined by a region surrounded by an inner peripheral edge of the $p^+$-type terminal region 14.

A bottom portion of the $p^+$-type terminal region 14 is formed at a position close to the second principal surface 4 of the semiconductor layer 2 with respect to a bottom portion of the p-type impurity region 13. The bottom portion of the $p^+$-type terminal region 14 is formed so as to have an interval from the $n^+$-type highly-concentrated region 11 toward the first principal surface 3 of the semiconductor layer 2.

The $p^+$-type terminal region 14 faces the $n^+$-type highly-concentrated region 11 with a partial region of the $n^-$-type drift region 12 interposed therebetween. In the $p^+$-type terminal region 14, an inner edge region 14*a* positioned on the p-type-impurity-region-13 side overlaps with the p-type impurity region 13.

With respect to a thickness direction of the semiconductor layer 2, the thickness (depth) of the p-type impurity region 13 may be 2.0 μm or more and 2.5 μm or less. With respect to the thickness direction of the semiconductor layer 2, the thickness (depth) of the $p^+$-type terminal region 14 may be 2.5 μm or more and 15 μm or less.

Referring to FIG. 3, in the surface layer portion of the first principal surface 3 of the semiconductor layer 2, a p-type concentration reducing region 16 is formed in a boundary region 15 between the p-type impurity region 13 and the $p^+$-type terminal region 14. In FIG. 3, the p-type concentration reducing region 16 is shown by dot hatching.

The p-type concentration reducing region 16 is formed at least in a connection region 17 of the p-type impurity region 13. The connection region 17 is a region in which the p-type impurity region 13 is connected to the $p^+$-type terminal region 14.

The p-type concentration reducing region 16 reduces a difference in concentration between the p-type impurity concentration of the p-type impurity region 13 and the p-type impurity concentration of the $p^+$-type terminal region 14. The p-type concentration reducing region 16 may be formed in a region outside the connection region 17 in addition to the region in the connection region 17 of the p-type impurity region 13.

A concentration ratio X/Y of the p-type concentration reducing region 16 may be 0.225 or more and 1.0 or less. Preferably, the concentration ratio X/Y of the p-type concentration reducing region 16 is 0.25 or more and 0.5 or less. The concentration ratio X/Y of the p-type concentration reducing region 16 is a concentration ratio of the p-type impurity concentration Y of the p-type concentration reducing region 16 to a p-type impurity concentration X of the $p^+$-type terminal region 14.

The p-type impurity concentration X of the $p^+$-type terminal region 14 may be $1.0\times10^{17}$ $cm^{-3}$ or more and $5.0\times10^{17}$ $cm^{-3}$ or less (for example, about $2.0\times10^{17}$ $cm^{-3}$). The p-type impurity concentration Y of the p-type concentration reducing region 16 may be $1\times10^{16}$ $cm^{-3}$ or more and $1.0\times10^{17}$ $cm^{-3}$ or less. Preferably, the p-type impurity concentration Y of the p-type concentration reducing region 16 is $4.5\times10^{16}$ $cm^{-3}$ or more and $8.0\times10^{16}$ $cm^3$ or less.

The p-type impurity region 13 may be formed so as to have the same function as the p-type concentration reducing region 16. In other words, a concentration ratio X/Z of a p-type impurity concentration Z of the p-type impurity region 13 to the p-type impurity concentration X of the $p^+$-type terminal region 14 may be set to fall within a range (X/Z=X/Y) equal to the concentration ratio X/Y of the p-type concentration reducing region 16.

Referring again to FIG. 2, in the outer region 7, a $p^+$-type field limiting region group 18 is formed in the surface layer portion of the first principal surface 3 of the semiconductor layer 2.

The $p^+$-type field limiting region group 18 includes a plurality of (in the present preferred embodiment, four) $p^+$-type field limiting regions 18A to 18D (hereinafter, referred to simply as "$p^+$-type field limiting regions 18A to 18D"). The $p^+$-type field limiting regions 18A to 18D are formed in this order from the $p^+$-type terminal region 14 toward the scribe region 8 with intervals between the field limiting regions.

The $p^+$-type field limiting regions 18A to 18D are each formed in an endless shape (for example, in a quadrangular annular shape) so as to surround the $p^+$-type terminal region 14 in the plan view in a region between the $p^+$-type terminal region 14 and the scribe region 8. The $p^+$-type field limiting regions 18A to 18D are also called FLRs (Field Limiting Rings).

A distance W1 between the $p^+$-type field limiting region 18A and the $p^+$-type terminal region 14 may be about 15 μm. Distances W2, W3, and W4 between the $p^+$-type field limiting regions 18A to 18D that adjoin each other become greater in this order from the $p^+$-type terminal-region-14 side toward the scribe-region-8 side. The distance W2 may be about 17 μm, the distance W3 may be about 19 μm, and the distance W4 may be about 23 μm.

In the outer region 7, an $n^+$-type channel stop region 19 is formed in the surface layer portion of the first principal surface 3 of the semiconductor layer 2. The $n^+$-type channel stop region 19 is formed in a region between the $p^+$-type field limiting region group 18 and the peripheral edge of the semiconductor layer 2.

The $n^+$-type channel stop region 19 has an n type impurity concentration higher than that of the semiconductor layer 2. Consequently, the $n^+$-type channel stop region 19 is formed as a region that is higher in concentration and that is lower in resistance than the semiconductor layer 2.

The $n^+$-type channel stop region 19 is formed in an endless shape (for example, in a quadrangular annular shape) so as to surround the $p^+$-type field limiting region group 18 in the plan view. The $n^+$-type channel stop region 19 may cross a boundary region between the outer region 7 and the scribe region 8, and may be exposed from the side surface 5 of the semiconductor layer 2. The $n^+$-type channel stop region 19 restrains a depletion layer from extending from a pn junction portion formed in an inner region of the semiconductor layer 2.

Referring to FIG. 2 and FIG. 3, an insulating layer is formed on the first principal surface 3 of the semiconductor layer 2. The insulating layer 21 has a layered structure including a first insulating film 22 and a second insulating film 23 that are laminated together in this order from the semiconductor-layer-2 side. The first insulating film 22 may include $SiO_2$. The second insulating film 23 may include PSG (Phosphosilicate Glass).

The insulating layer 21 has a first opening 24, a plurality of second openings 25, and a third opening 26. The first opening 24 exposes the p-type impurity region 13 and the $p^+$-type terminal region 14. The second openings 25 expose the $p^+$-type field limiting regions 18A to 18D, respectively. The third opening 26 exposes the $n^+$-type channel stop region 19.

The first opening 24 is formed in a quadrangular shape having four sides respectively parallel to the sides of the semiconductor layer 2 in the plan view. An inner wall surface that defines the first opening 24 is positioned on the $p^+$-type terminal region 14. The first opening 24 exposes an inner peripheral region of the $p^+$-type terminal region 14 in addition to the whole area of the p-type impurity region 13.

The second openings 25 are formed along the $p^+$-type field limiting regions 18A to 18D, respectively. Each of the second openings 25 is formed in a quadrangular annular shape in the plan view.

An inner wall surface that defines each of the second openings 25 is positioned on a corresponding one of the $p^+$-type field limiting regions 18A to 18D. The second openings 25 expose inner regions of the corresponding $p^+$-type field limiting regions 18A to 18D, respectively.

The third opening 26 is formed along the $n^+$-type channel stop region 19. The third opening 26 is formed in a quadrangular annular shape in the plan view. An inner wall surface that defines the third opening 26 is positioned on the $n^+$-type channel stop region 19. The third opening 26 exposes an inner region of the $n^+$-type channel stop region 19.

An electrode layer 31 is formed on the first principal surface 3 of the semiconductor layer 2. The electrode layer 31 includes an anode electrode 32, a plurality of field plates 33, and an equipotential electrode 34. The anode electrode 32 is formed as an example of a surface electrode.

The anode electrode 32 is formed in a quadrangular shape having four sides respectively parallel to the sides of the semiconductor layer 2 in the plan view. The anode electrode 32 is electrically connected to the p-type impurity region 13 and to the $p^+$-type terminal region 14.

Referring to FIG. 3, the anode electrode 32 includes a connection portion 35 and a drawn portion 36. The connection portion 35 of the anode electrode 32 is arranged inside the first opening 24, and is connected to the p-type impurity region 13 and to the $p^+$-type terminal region 14. The connection portion 35 of the anode electrode 32 is also connected to the p-type concentration reducing region 16.

The connection portion 35 of the anode electrode 32 has a connection end portion 35*a* positioned on the $p^+$-type terminal region 14. The connection portion 35 of the anode electrode 32 forms an ohmic contact with the p-type impurity region 13 and with the $p^+$-type terminal region 14.

The drawn portion 36 of the anode electrode 32 is connected to the connection portion 35. The drawn portion 36 of the anode electrode 32 is continuously drawn out onto the insulating layer 21 from the inside of the first opening 24 toward the scribe-region-8 side. The drawn portion 36 of the anode electrode 32 faces the $p^+$-type terminal region 14 with the insulating layer 21 therebetween.

A connection size S1 of the anode electrode 32 may be 30 μm or more. Preferably, the connection size S1 of the anode electrode 32 is 60 μm or more. The connection size S1 of the anode electrode 32 is a connection size of the connection portion 35 of the anode electrode 32 with respect to the $p^+$-type terminal region 14. The connection size S1 of the anode electrode 32 is also a distance between the inner peripheral edge of the $p^+$-type terminal region 14 and the connection end portion 35*a* of the anode electrode 32 (the inner wall surface of the first opening 24 of the insulating layer 21).

Referring again to FIG. 2, the field plates 33 are formed along the $p^+$-type field limiting regions 18A to 18D, respectively, in the plan view. Each of the field plates 33 is formed in a quadrangular annular shape in the plan view.

Each of the field plates 33 enters a corresponding second opening 25 from above the insulating layer 21. Each of the field plates 33 is connected to a corresponding one of the $p^+$-type field limiting regions 18A to 18D in the corresponding second opening 25.

The field plate 33 formed on the outermost side may include a drawn portion 37. The drawn portion 37 is continuously drawn out onto the insulating layer 21 from the inside of the second opening 25 toward the scribe-region-8 side.

Referring to FIG. 2, the equipotential electrode 34 is formed along the $n^+$-type channel stop region 19 in the plan view. The equipotential electrode 34 is formed in a quadrangular annular shape in the plan view. The equipotential electrode 34 is also called an EQR (EQui-potential Ring) electrode.

The equipotential electrode 34 enters the third opening 26 from above the insulating layer 21. The equipotential electrode 34 is connected to the $n^+$-type channel stop region 19 in the third opening 26. An insulation distance L between an inner peripheral edge of the equipotential electrode 34 and an outer peripheral edge of the field plate 33 formed on the outermost side may be 30 μm or more and 60 μm or less.

A surface protection film 41 is formed on the first principal surface 3 of the semiconductor layer 2. The surface protection film 41 coats the electrode layer 31. The surface protection film 41 covers the device formation region 6 and the outer region 7, and exposes the scribe region 8 in the present preferred embodiment. The surface protection film 41 may include an organic insulating material, such as epoxy resin or polyimide resin. The surface protection film 41 may include an inorganic insulating material, such as $SiO_2$ or SiN.

A pad opening 42 by which a partial region of the anode electrode 32 is exposed as an anode pad is formed in the surface protection film 41. A cathode electrode 43 serving as a back-surface electrode is connected to the second principal surface 4 of the semiconductor layer 2. The cathode electrode 43 coats the second principal surface 4 of the semiconductor layer 2, and is connected to the $n^+$-type highly-concentrated region 11.

Figure 4:
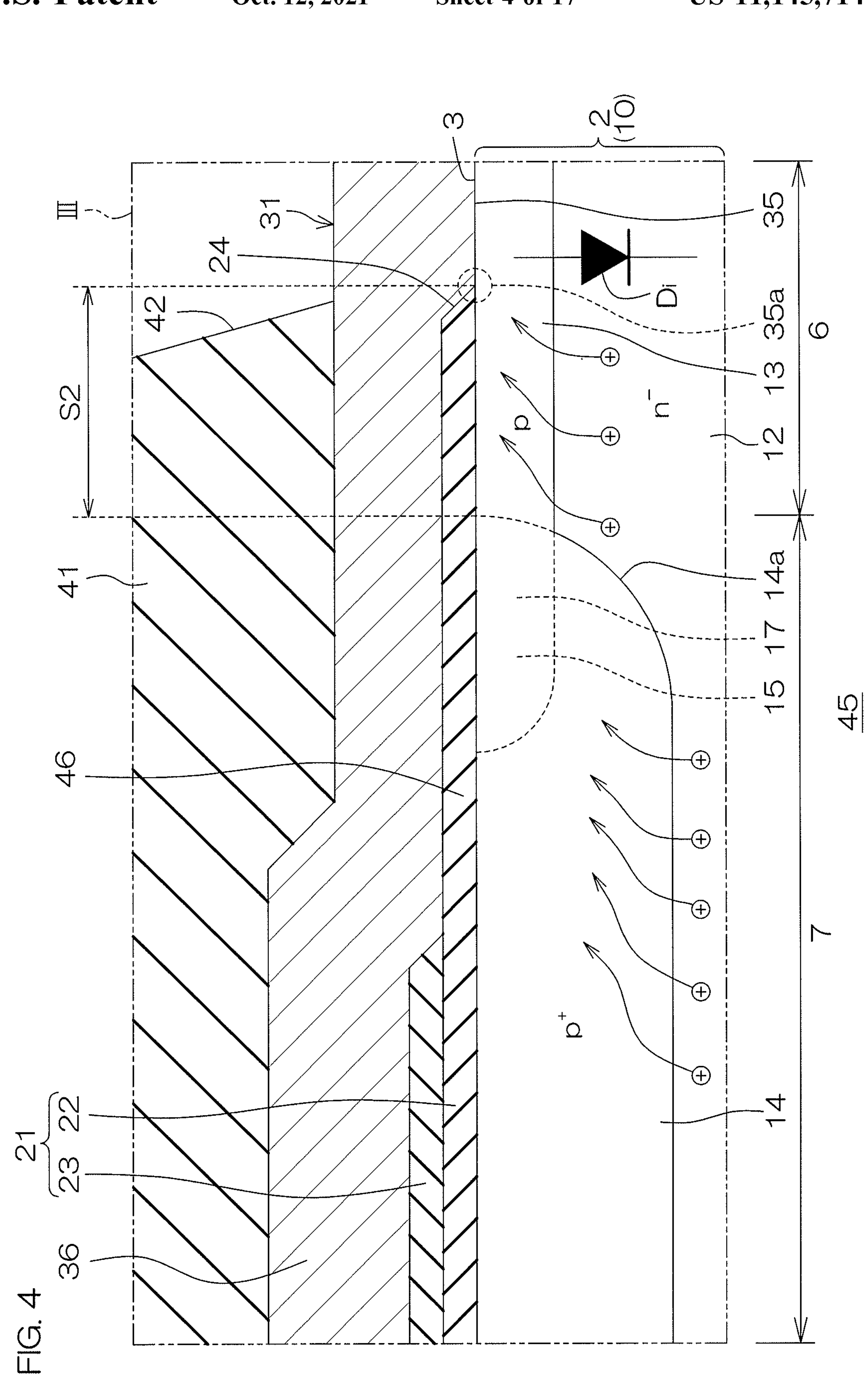
FIG. 4 is a view that shows a region corresponding to FIG. 3 and that describes a semiconductor device according to a reference example.

FIG. 4 is a view to describe a semiconductor device 45 according to a reference example. FIG. 4 is also a view of a region corresponding to FIG. 3. In FIG. 4, the same reference sign is given to a structure equivalent to each structure shown in FIG. 3 etc., and description thereof is omitted.

Referring to FIG. 4, the p-type concentration reducing region 16 is not formed in the semiconductor device 45 according to the reference example. In the semiconductor device 45 according to the reference example, the connection portion 35 of the anode electrode 32 is not connected to the $p^+$-type terminal region 14.

In the semiconductor device 45 according to the reference example, the insulating layer 21 has a coating portion 46 with which the p-type impurity region 13 is coated. Therefore, the inner wall surface of the first opening 24 of the insulating layer 21 is positioned on the p-type impurity region 13.

The coating portion 46 of the insulating layer 21 extends from a region on the $p^+$-type terminal region 14 toward a region on the p-type impurity region 13. The coating portion 46 of the insulating layer 21 crosses the boundary region 15 between the p-type impurity region 13 and the $p^+$-type terminal region 14.

The coating portion 46 of the insulating layer 21 may be made of $SiO_2$. The coating portion 46 of the insulating layer 21 may be a bird's beak portion of the insulating layer 21. The bird's beak portion may have a structure in which the thickness of a part positioned on the p-type impurity-region-13 side is smaller than the thickness of a part positioned on the $p^+$-type terminal-region-14 side.

In the semiconductor device 45 according to the reference example, the inner wall surface (inner edge) of the first opening 24 is defined by an inner wall surface (inner edge) of the coating portion 46 of the insulating layer 21. The connection portion 35 of the anode electrode 32 is connected to only the p-type impurity region 13 by the coating portion 46.

A connection size S2 of the insulating layer 21 is about 10 μm. The connection size S2 of the insulating layer 21 is a connection size of the coating portion 46 of the insulating layer 21 with respect to the p-type impurity region 13. The connection size S2 of the insulating layer 21 is also a distance between the inner peripheral edge of the $p^+$-type terminal region 14 and the connection end portion 35*a* of the anode electrode 32 (the inner wall surface of the first opening 24 of the insulating layer 21).

Electric characteristics were examined concerning the semiconductor device 45 according to the reference example and the semiconductor device 1, and therefore results obtained by this examination will be hereinafter described.

Herein, a recovery characteristic (reverse-recovery characteristic) that is one of the electric characteristics was calculated by simulations. The recovery characteristic denotes a characteristic of an electric current flowing between the anode electrode 32 and the cathode electrode 43 when a voltage between the anode electrode 32 and the cathode electrode 43 is switched from ON to OFF.

Figure 5:
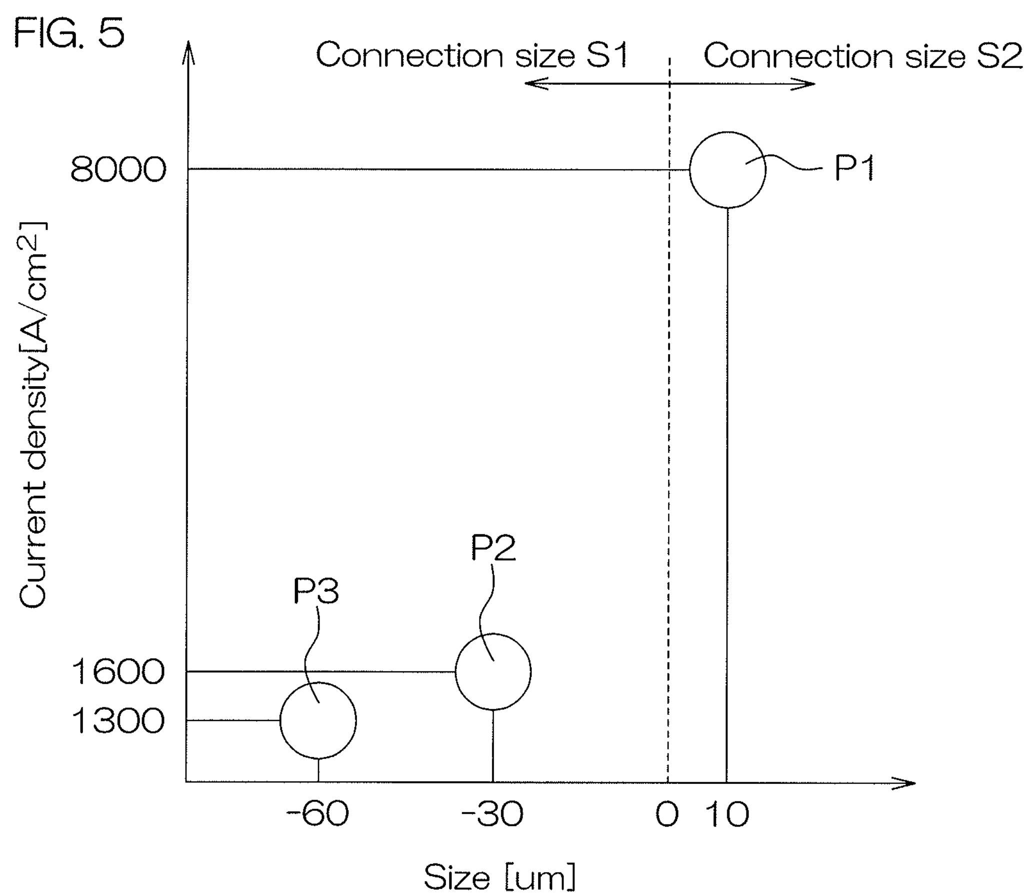
FIG. 5 is a graph to describe a relationship between a connection size of an anode electrode with respect to a $p^+$-type terminal region and a current density when a recovery operation is performed.

FIG. 5 is a graph to describe a relationship between a connection size of the anode electrode 32 with respect to the $p^+$-type terminal region 14 and a current density when a recovery operation is performed.

In FIG. 5, the ordinate axis represents a current density [$A/cm^2$], and the abscissa axis represents a distance [μm]. The current density is a current density near the boundary region 15 between the p-type impurity region 13 and the $p^+$-type terminal region 14.

The distance is a distance between the inner peripheral edge of the $p^+$-type terminal region 14 and the connection end portion 35*a* of the anode electrode 32 (the inner wall surface of the first opening 24 of the insulating layer 21) when the inner peripheral edge of the $p^+$-type terminal region 14 is set at zero. Based on a zero point of the abscissa axis, a left-side region corresponds to the connection size S1 of the anode electrode 32 (see FIG. 3), whereas a right-side region corresponds to the connection size S2 of the insulating layer 21 (see FIG. 4).

A plot P1, a plot P2, and a plot P3 are shown in FIG. 5.

The plot P1 represents a current density when the connection size S2 of the insulating layer 21 is 10 μm in the semiconductor device 45 according to the reference example.

The plot P2 represents a current density when the connection size S1 of the anode electrode 32 is 30 μm in the semiconductor device 1. The plot P3 represents a current density when the connection size S1 of the anode electrode 32 is 60 μm in the semiconductor device 1.

Referring to the plot P1, in the semiconductor device 45 according to the reference example, the current density near the boundary region 15 was about 8000 $Acm^{-2}$.

On the other hand, referring to the plot P2, in the semiconductor device 1, the current density near the boundary region 15 was about 1600 $Acm^{-2}$ when the connection size S1 of the anode electrode 32 was 30 μm. Additionally, referring to the plot P3, in the semiconductor device 1, the current density near the boundary region 15 was about 1300 $Acm^{-2}$ when the connection size S1 of the anode electrode 32 was 60 μm.

Figure 6:
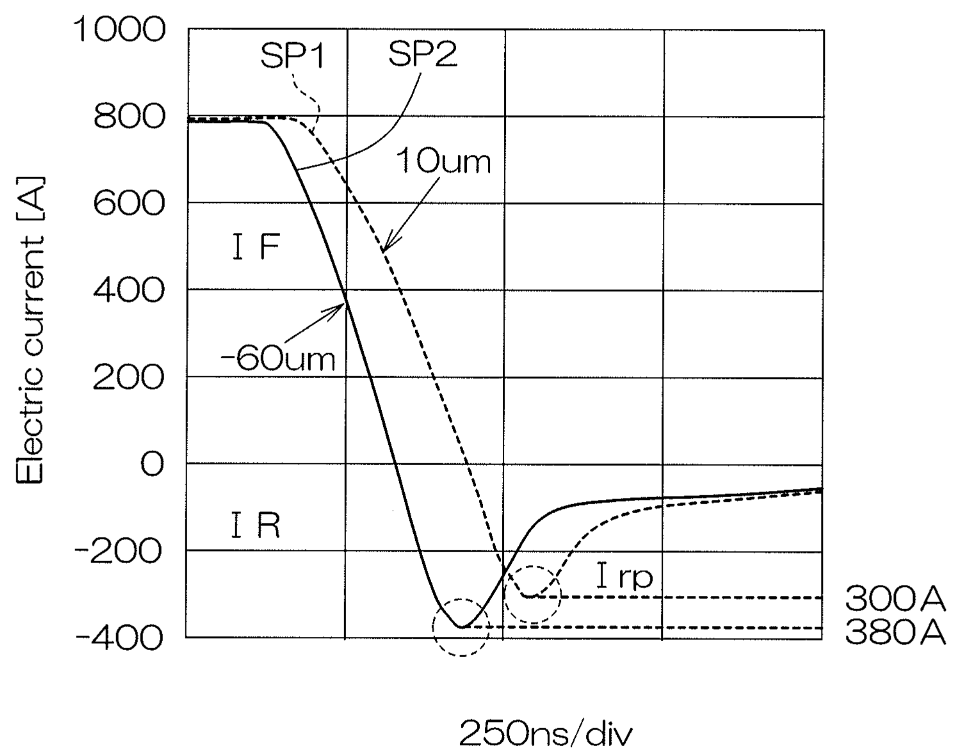
FIG. 6 is a graph to describe a relationship between a connection size of an anode electrode with respect to a $p^+$-type terminal region and a reverse current when a recovery operation is performed.

FIG. 6 is a graph to describe a relationship between a connection size of the anode electrode 32 with respect to the $p^+$-type terminal region 14 and a reverse current IR when a recovery operation is performed.

In FIG. 6, the ordinate axis represents an electric current [A], and the abscissa axis represents time [ns/div]. In the ordinate axis, a positive region is a region of a forward current IF, whereas a negative region is a region of a reverse current IR.

Herein, current waveforms were examined, according to simulations, when a shift was made from a state in which a forward current IF of 800 A is allowed to flow between the anode electrode 32 and the cathode electrode 43 to a state in which a recovery operation is performed, such that the semiconductor layer 2 was brought into a breakdown state.

A first characteristic SP1 (see the broken line) and a second characteristic SP2 (see the solid line) are shown in FIG. 6. The first characteristic SP1 shows a current waveform when the connection size S2 of the insulating layer 21 is 10 μm in the semiconductor device 45 according to the reference example. The second characteristic SP2 shows a current waveform when the connection size S1 of the anode electrode 32 is 60 μm in the semiconductor device 1.

Referring to the first characteristic SP1, a peak reverse current IRP that is a peak value of the reverse current IR was 300 A in the semiconductor device 45 according to the reference example. Therefore, a breakdown state is reached when the peak reverse current IRP becomes 300 A or more in the semiconductor device 45 according to the reference example.

On the other hand, referring to the second characteristic SP2, the peak reverse current IRP that is the peak value of the reverse current IR was 380 A in the semiconductor device 1.

Referring to FIG. 5 and FIG. 6, it has been understood that the current density becomes comparatively large, and the acceptable range of the peak reverse current IRP becomes comparatively narrow in the semiconductor device 45 according to the reference example. The cause of this problem can be inferred as follows.

In detail, referring again to FIG. 4, the semiconductor device 45 according to the reference example has a structure in which the anode electrode 32 is connected only to the p-type impurity region 13. Therefore, when switching is performed from ON to OFF, positive holes flowing through the $p^+$-type terminal region 14 flow into the anode electrode 32 through the p-type impurity region 13.

Therefore, the current density rapidly rises in a region in which positive holes flowing through the $p^+$-type terminal region 14 and positive holes flowing through the p-type impurity region 13 join together. The positive holes flowing through the $p^+$-type terminal region 14 and the positive holes flowing through the p-type impurity region 13 each form a reverse current IR flowing between the anode electrode 32 and the cathode electrode 43.

Additionally, in the semiconductor device 45 according to the reference example, a comparatively large concentration difference exists between the p-type impurity concentration of the p-type impurity region 13 and the p-type impurity concentration of the $p^+$-type terminal region 14. The density of the positive holes (the current density of the electric current) flowing through the $p^+$-type terminal region 14 is higher than the density of the positive holes (the current density of the electric current) flowing through the p-type impurity region 13. Therefore, when switching is performed from ON to OFF, the current density rapidly rises in the boundary region 15 in which the positive holes flowing through the $p^+$-type terminal region 14 and the positive holes flowing through the p-type impurity region 13 join together.

Furthermore, in the semiconductor device 45 according to the reference example, the coating portion 46 of the insulating layer 21 is formed in a region in which the positive holes flowing through the $p^+$-type terminal region 14 and the positive holes flowing through the p-type impurity region 13 join together on the first principal surface 3 of the semiconductor layer 2.

The positive holes that have joined together detour the coating portion 46 of the insulating layer 21, and reach the anode electrode 32. Therefore, the coating portion 46 of the insulating layer 21 has a cause for which the current density rapidly rises in the boundary region 15 between the p-type impurity region 13 and the $p^+$-type terminal region 14.

In the semiconductor device 45 according to the reference example, a rapid rise in temperature near the anode electrode 32 or near the p-type impurity region 13 is caused by an increase in current density as mentioned above. As a result, it is conceivable that the semiconductor layer 2 became easily breakable, and the peak reverse current IRP was lowered.

On the other hand, in the semiconductor device 1, the anode electrode 32 crosses the boundary region 15 between the p-type impurity region 13 and the $p^+$-type terminal region 14. Additionally, the anode electrode 32 is connected to the p-type impurity region 13, and has the connection portion 35 connected to the $p^+$-type terminal region 14.

Therefore, when the semiconductor device 1 performs switching from ON to OFF, it is possible to allow positive holes to directly flow from the p-type impurity region 13 into the anode electrode 32. Likewise, it is possible to allow positive holes to directly flow from the $p^+$-type terminal region 14 into the anode electrode 32. This makes it possible to restrain an increase in current density and a rise in temperature in the boundary region 15 between the p-type impurity region 13 and the $p^+$-type terminal region 14.

Furthermore, in the semiconductor device 1, the p-type concentration reducing region 16 is provided in the boundary region 15 between the p-type impurity region 13 and the $p^+$-type terminal region 14. The p-type concentration reducing region 16 reduces a concentration difference between the p-type impurity concentration of the p-type impurity region 13 and the p-type impurity concentration of the $p^+$-type terminal region 14. This makes it possible to further restrain an increase in current density and a rise in temperature in the boundary region 15 between the p-type impurity region 13 and the $p^+$-type terminal region 14.

As a result, it is possible to lower the current density of the boundary region 15 between the p-type impurity region 13 and the $p^+$-type terminal region 14 as shown in FIG. 5. Therefore, it is possible to provide a semiconductor device 1 that is capable of improving the breakdown tolerance by increasing an acceptable range of a peak reverse current IRP as shown in FIG. 6.

Figure 7:
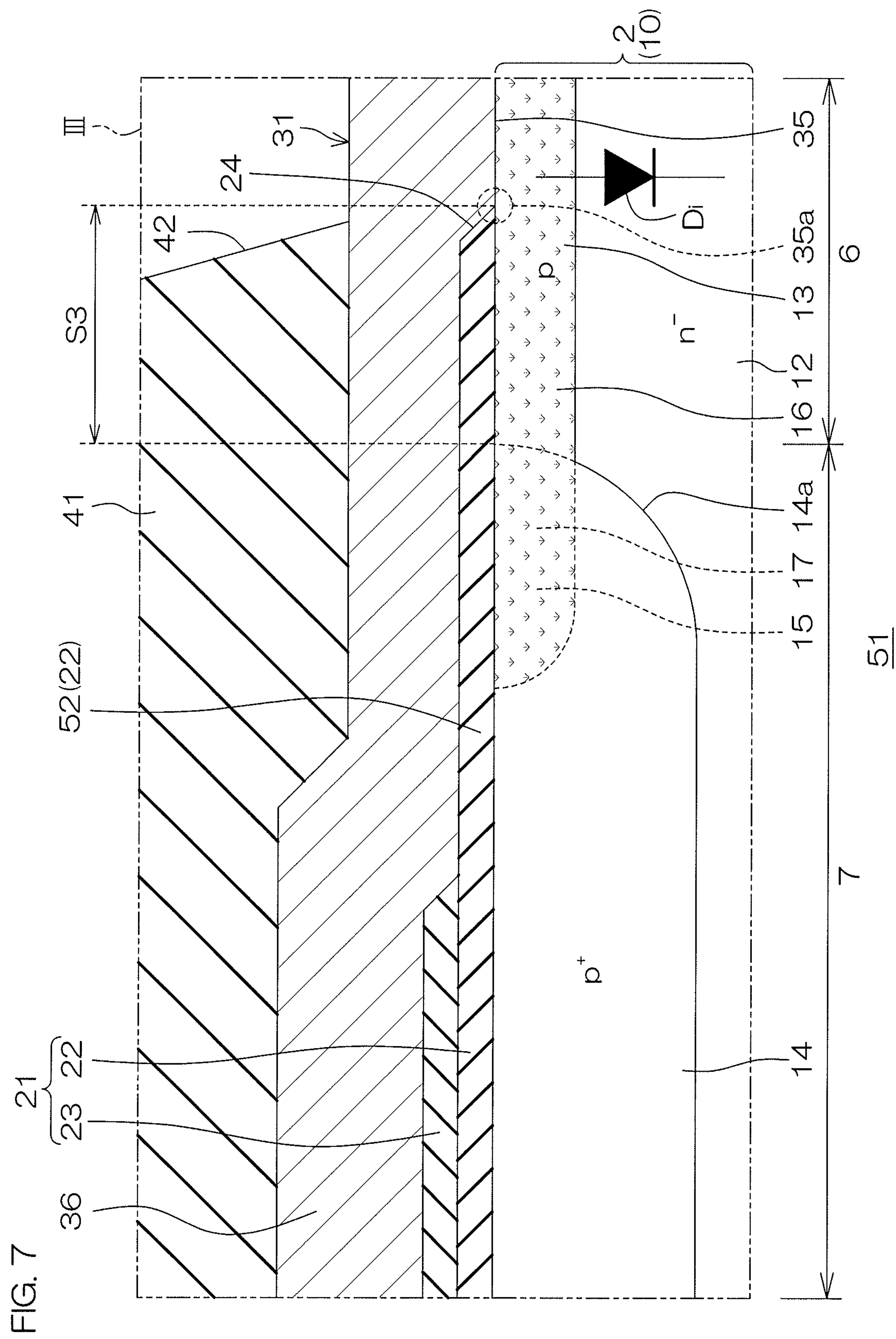
FIG. 7 is a view that shows a region corresponding to FIG. 3 and that describes a semiconductor device according to a second preferred embodiment of the present invention.

FIG. 7 is a view that shows a region corresponding to FIG. 3 and that describes a semiconductor device 51 according to a second preferred embodiment of the present invention. In FIG. 7, the same reference sign is given to a structure equivalent to each structure shown in FIG. 3 etc., and a description thereof is omitted.

Referring to FIG. 7, in the semiconductor device 51, the connection portion 35 of the anode electrode 32 is not connected to the $p^+$-type terminal region 14. In the semiconductor device 51, the connection portion 35 of the anode electrode 32 has the connection end portion *35a* positioned on the p-type impurity region 13.

In the semiconductor device 51, the insulating layer 21 has a coating portion 52 with which the p-type impurity region 13 is coated. In FIG. 7, the p-type impurity region 13 is shown by dot hatching. The inner wall surface of the first opening 24 of the insulating layer 21 is formed on the p-type impurity region 13.

The coating portion 52 of the insulating layer 21 crosses the boundary region 15 between the p-type impurity region 13 and the $p^+$-type terminal region 14. The coating portion 52 of the insulating layer 21 extends from a region on the $p^+$-type terminal region 14 toward a region on the p-type impurity region 13.

The coating portion 52 of the insulating layer 21 includes the first insulating film 22. The coating portion 52 of the insulating layer 21 is formed as a thin film portion having a thickness smaller than a total value of the thickness of the first insulating film 22 and the thickness of the second insulating film 23. The coating portion 52 of the insulating layer 21 may include the second insulating film 23 in addition to the first insulating film 22. The insulating layer 21 may be formed with a uniform thickness.

In the semiconductor device 51, the inner wall surface (inner edge) of the first opening 24 is defined by an inner wall surface (inner edge) of the coating portion 52 of the insulating layer 21. A connection size S3 of the coating portion 52 of the insulating layer 21 with respect to the p-type impurity region 13 may be about 10 μm.

The connection size S3 of the coating portion 52 of the insulating layer 21 with respect to the p-type impurity region 13 is also a distance between the inner peripheral edge of the $p^+$-type terminal region 14 and the connection end portion *35a* of the anode electrode 32 (the inner wall surface of the first opening 24 of the insulating layer 21).

The p-type concentration reducing region 16 is formed the connection region 17 of the p-type impurity region 13 and in the p-type impurity region 13. The p-type concentration reducing region 16 is preferably formed in the p-type impurity region 13 exposed from the coating portion 52. In other words, the p-type concentration reducing region 16 is preferably formed in a region surrounded by the inner wall surface (inner edge) of the coating portion 52.

The thus formed structure creates a structure in which the connection portion 35 of the anode electrode 32 is connected to the p-type impurity region 13 and to the p-type concentration reducing region 16 even when the coating portion 52 of the insulating layer 21 is present.

This makes it possible to locate a region in which an electric current flowing through the $p^+$-type terminal region (the p-type concentration reducing region 16) and an electric current flowing through the p-type impurity region 13 join together at a position away from the inner wall surface (the inner edge) of the coating portion 52. Therefore, it is possible to restrain a rise in current density near the inner wall surface (the inner edge) of the coating portion 52.

In the present preferred embodiment, the p-type impurity region 13 having the same function as the p-type concentration reducing region 16 is formed. In other words, the concentration ratio X/Z of the p-type impurity concentration Z of the p-type impurity region 13 to the p-type impurity concentration X of the $p^+$-type terminal region 14 is set to be equal to the concentration ratio X/Y of the p-type impurity concentration Y of the p-type concentration reducing region 16 to the p-type impurity concentration X of the $p^+$-type terminal region 14 (X/Z=X/Y).

In this case, it is possible to regard the connection portion 35 of the anode electrode 32 as being connected to the p-type concentration reducing region 16 in its whole area. The p-type impurity concentration X of the $p^+$-type terminal region 14, the p-type impurity concentration Y of the p-type concentration reducing region 16, and the p-type impurity concentration Z of the p-type impurity region 13 are the same as in the first preferred embodiment, and therefore a concrete description of these concentrations is omitted.

Figure 8:
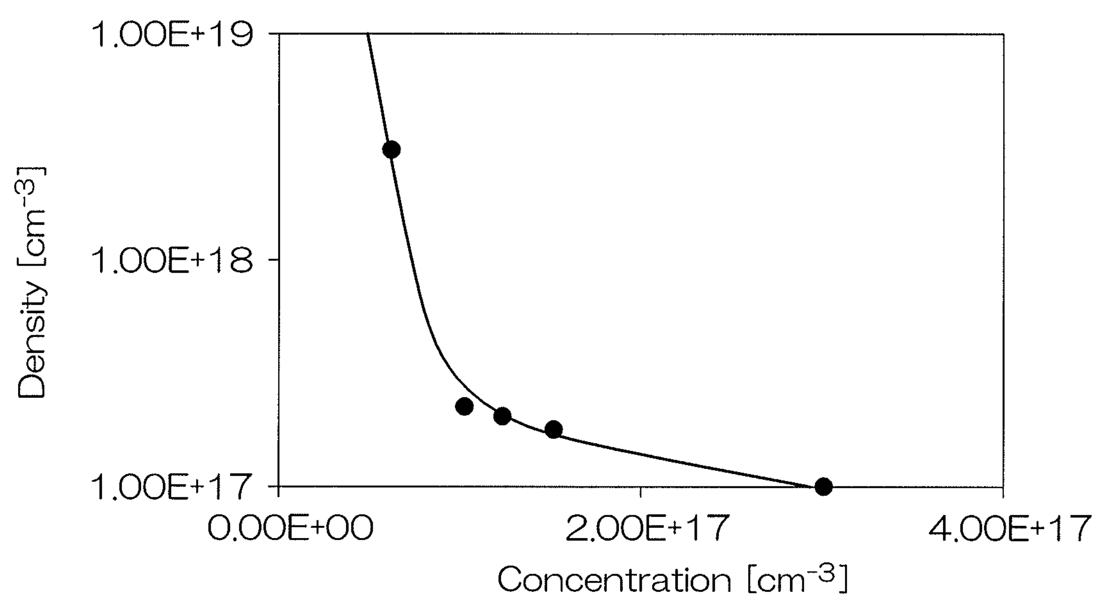
FIG. 8 is a graph to describe a relationship between a p-type impurity concentration of a p-type concentration reducing region and a current density.

FIG. 8 is a graph to describe a relationship between a p-type impurity concentration of the p-type concentration reducing region 16 and a current density.

In FIG. 8, the ordinate axis represents a current density [$cm^{-3}$], and the abscissa axis represents a p-type impurity concentration [$cm^{-3}$] of the p-type concentration reducing region 16. More specifically, the ordinate axis represents a current density near the boundary region 15 between the p-type impurity region 13 and the $p^+$-type terminal region 14.

Referring to FIG. 8, the current density near the boundary region 15 was decreased when the p-type impurity concentration of the p-type concentration reducing region 16 was increased. On the other hand, the current density near the boundary region 15 was increased when the p-type impurity concentration of the p-type concentration reducing region 16 was decreased.

From this fact, it has been understood that it is possible to decrease the current density near the boundary region 15 by increasing the p-type impurity concentration of the p-type concentration reducing region 16 even if the insulating layer 21 has the coating portion 52.

As described above, in the semiconductor device 51, the p-type concentration reducing region 16 is arranged in the boundary region 15 between the p-type impurity region 13 and the $p^+$-type terminal region 14. The p-type concentration reducing region 16 is formed in the connection region 17 of the p-type impurity region 13 and a region surrounded by the inner wall surface (inner edge) of the coating portion 52 of the insulating layer 21.

In the present preferred embodiment, the p-type impurity region 13 itself is formed as the p-type concentration reducing region 16. The p-type concentration reducing region 16 reduces a concentration difference between the p-type impurity concentration of the p-type impurity region 13 and the p-type impurity concentration of the $p^+$-type terminal region 14. This makes it possible to lower the current density of the boundary region 15 between the p-type impurity region 13 and the $p^+$-type terminal region 14 (see FIG. 8 also).

As a result, it is possible to restrain a rise in temperature near the boundary region 15 between the p-type impurity region 13 and the $p^+$-type terminal region 14. Therefore, it is possible to increase the acceptable range of the peak reverse current IRP, and it is possible to provide the semiconductor device 51 capable of improving the breakdown tolerance.

Figure 9:
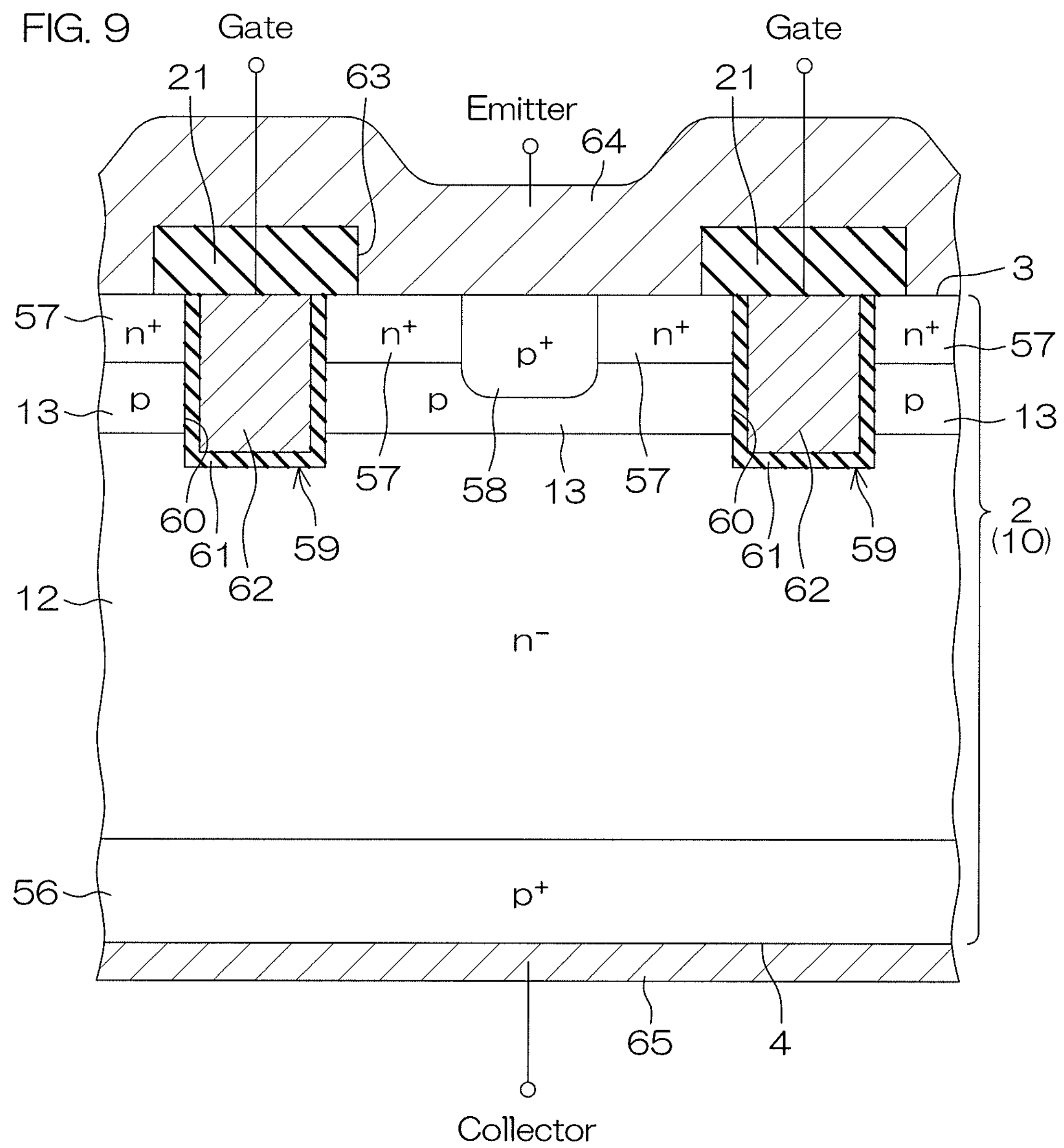
FIG. 9 is a schematic cross-sectional view showing a semiconductor device according to a third preferred embodiment of the present invention.

FIG. 9 is a schematic cross-sectional view showing a semiconductor device 55 according to a third preferred embodiment of the present invention. In FIG. 9, the same reference sign is given to a structure equivalent to each structure described in the first preferred embodiment, and a description thereof is omitted.

The semiconductor device 55 is a switching device that has a structure in which an IGBT (Insulated Gate Bipolar Transistor), instead of the pn junction diode Di, is formed in the device formation region 6.

In the semiconductor device 55, a $p^+$-type collector region 56, instead of the $n^+$-type highly-concentrated region 11, is formed in the surface layer portion of the second principal surface 4 of the semiconductor layer 2. In the semiconductor layer 2, an $n^-$-type region outside the $p^+$-type collector region 56 is formed as the $n^-$-type drift region 12.

In the device formation region 6, the p-type impurity region 13 is formed in the surface layer portion of the first principal surface 3 of the semiconductor layer 2 so as to serve as a p-type channel region of the IGBT. An $n^+$-type emitter region 57 and a $p^+$-type contact region 58 are formed at a surface portion of the p-type impurity region 13. The $p^+$-type contact region 58 passes through the $n^+$-type emitter region 57, and is connected to the p-type impurity region 13.

In the device formation region 6, a trench gate structure 59 is additionally formed at the surface portion of the p-type impurity region 13. A trench gate structure 59 has a structure that includes a gate trench 60 formed by digging down the surface layer portion of the first principal surface 3 of the semiconductor layer 2 and in which a gate electrode 62 is embedded in the gate trench 60 with a gate insulating film 61 therebetween.

The gate electrode 62 faces the p-type impurity region 13 with the gate insulating film 61 therebetween. More specifically, the gate electrode 62 faces the $n^+$-type emitter region 57, the p-type impurity region 13, and the $n^-$-type drift region 12 with the gate insulating film 61 therebetween. An inner wall surface of the gate trench 60 defines a part of the first principal surface 3 of the semiconductor layer 2.

The insulating layer 21 is formed on the first principal surface 3 of the semiconductor layer 2. The insulating layer 21 may have a layered structure including the first insulating film 22 and the second insulating film 23. The insulating layer 21 may have a single-layer structure consisting of the first insulating film 22. The insulating layer 21 has a third opening 63 by which the $n^+$-type emitter region 57 and the $p^+$-type contact region 58 are exposed, in addition to the first opening 24, the second opening 25, and the third opening 26.

An emitter electrode 64 serving as an example of a surface electrode, instead of the anode electrode 32, is formed on the first principal surface 3 of the semiconductor layer 2. The emitter electrode 64 enters the third opening 63 from above the insulating layer 21. The emitter electrode 64 is electrically connected to the $n^+$-type emitter region 57 and to the $p^+$-type contact region 58 in the third opening 63.

A collector electrode 65 serving as a back-surface electrode, instead of the cathode electrode 43, is formed on the side of the second principal surface 4 of the semiconductor layer 2. The collector electrode 65 coats the second principal surface 4 of the semiconductor layer 2, and is connected to the $p^+$-type collector region 56.

As described above, it is possible to likewise fulfill the same working effects as those described in the first preferred embodiment by employing a structure including the IGBT instead of the pn junction diode Di as in the semiconductor device 55. Of course, the structure of the semiconductor device 51 according to the second preferred embodiment may be applied to the semiconductor device 55.

Figure 10:
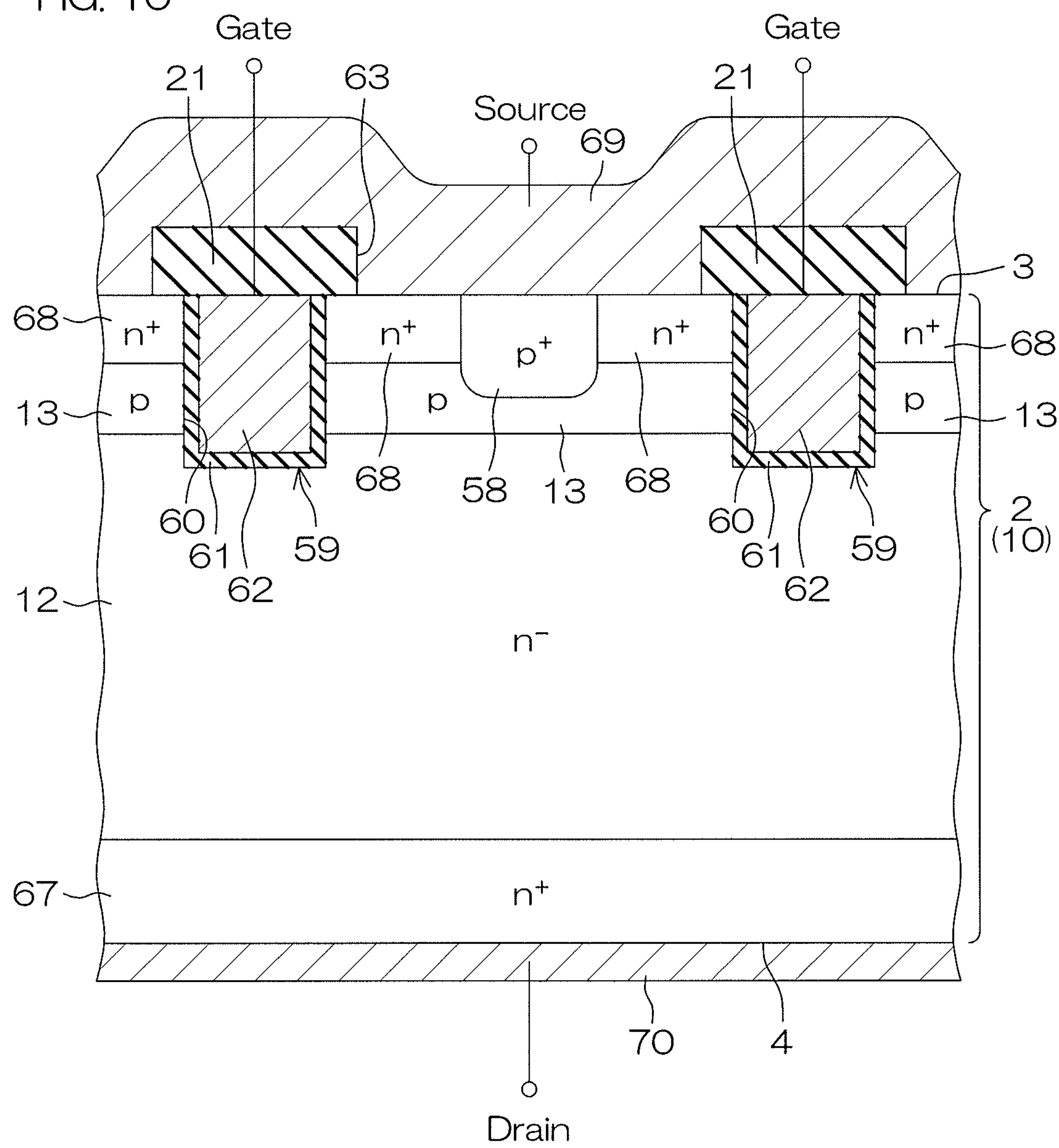
FIG. 10 is a schematic cross-sectional view showing a semiconductor device according to a fourth preferred embodiment of the present invention.

FIG. 10 is a schematic cross-sectional view showing a semiconductor device 66 according to a fourth preferred embodiment of the present invention. In FIG. 10, the same reference sign is given to a structure equivalent to each structure described in the first and third preferred embodiments, and a description thereof is omitted.

The semiconductor device 66 is a switching element having a structure in which a MISFET (Metal Insulator Semiconductor Field Effect Transistor), instead of the IGBT according to the third preferred embodiment, is formed in the device formation region 6.

An $n^+$-type drain region 67, instead of the $p^+$-type collector region 56, is formed in the surface layer portion of the second principal surface 4 of the semiconductor layer 2. In this structure, the $n^+$-type emitter region 57 is equivalent to an $n^+$-type source region 68, and the emitter electrode 64 is equivalent to a source electrode 69, and the collector electrode 65 is equivalent to a drain electrode 70.

As described above, it is possible to likewise fulfill the same working effects as those described in the first preferred embodiment by employing a structure including the MISFET instead of the IGBT as in the semiconductor device 66. Of course, the structure of the semiconductor device 51 according to the second preferred embodiment may be applied to the semiconductor device 66.

Figure 11:
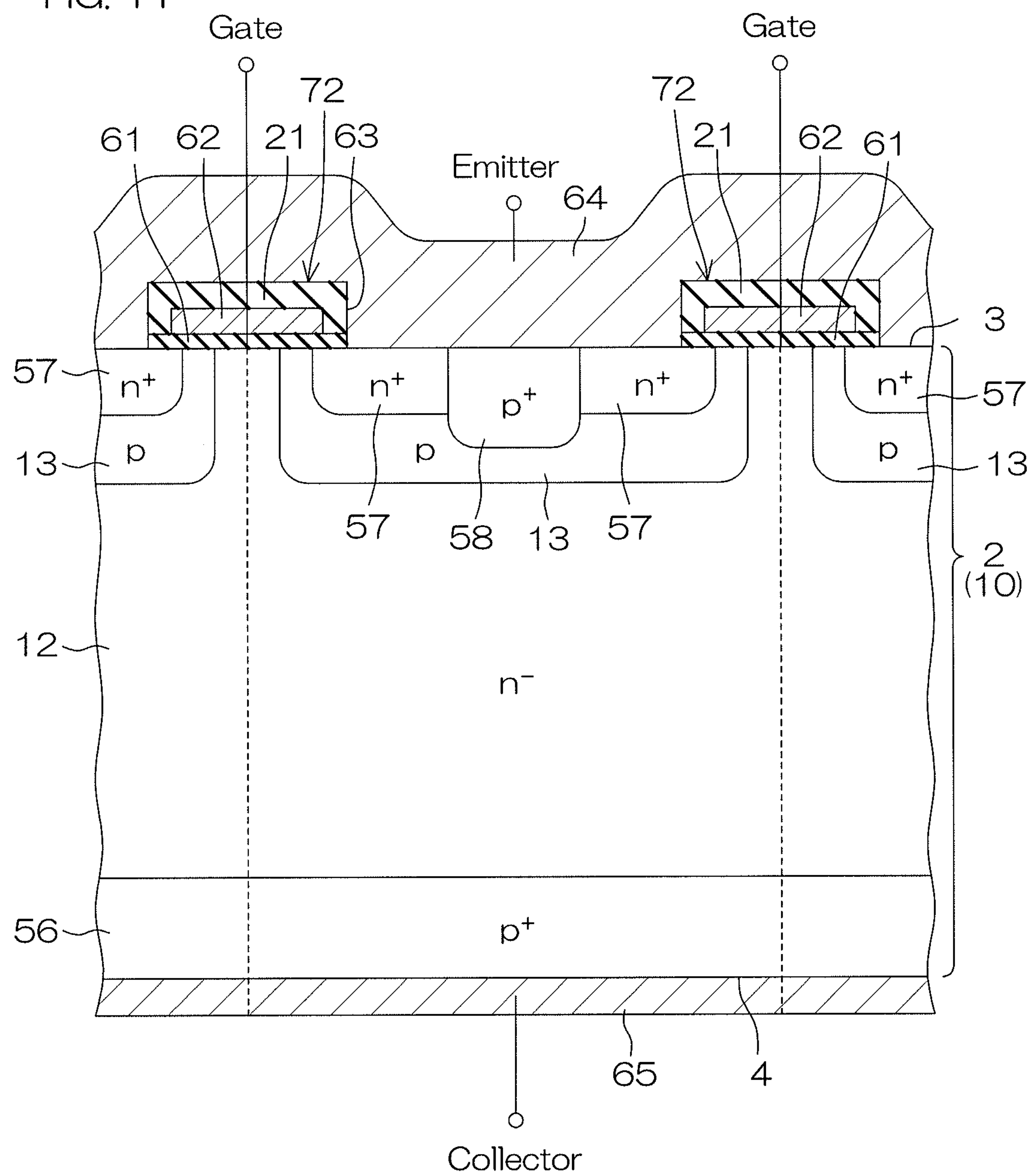
FIG. 11 is a schematic cross-sectional view showing a semiconductor device according to a fifth preferred embodiment of the present invention.

FIG. 11 is a schematic cross-sectional view showing a semiconductor device 71 according to a fifth preferred embodiment of the present invention. In FIG. 11, the same reference sign is given to a structure equivalent to each structure described in the third preferred embodiment, and a description thereof is omitted.

The semiconductor device 71 includes a planar-gate type IGBT, instead of the trench-gate type IGBT, in the device formation region 6. In the device formation region 6, a plurality of p-type impurity regions 13 each of which serves as a p-type channel region of the IGBT are formed in the surface layer portion of the first principal surface 3 of the semiconductor layer 2 such that the p-type impurity regions 13 have intervals therebetween.

The device formation region 6 is defined by a region surrounded by the $p^+$-type terminal region 14 (the outer region 7). The $n^+$-type emitter region 57 and the $p^+$-type contact region 58 are formed in the surface layer portion of the p-type impurity region 13 with an interval set inside from the peripheral edge of the p-type impurity region 13.

In the device formation region 6, a planar gate structure 72 is formed on the first principal surface 3 of the semiconductor layer 2. The planar gate structure 72 includes the gate electrode 62 facing the p-type impurity region 13 with the gate insulating film 61 interposed therebetween.

More specifically, the gate electrode 62 faces the $n^+$-type emitter region 57, the p-type impurity region 13, and the $n^-$-type drift region 12 with the gate insulating film 61 interposed therebetween. The planar gate structure 72 is coated with the insulating layer 21.

The insulating layer 21 may have a layered structure including the first insulating film 22 and the second insulating film 23. The insulating layer 21 may have a single-layer structure consisting of the first insulating film 22. The insulating layer 21 has the third opening 63 by which the $n^+$-type emitter region 57 and the $p^+$-type contact region 58 are exposed, in addition to the first opening 24, the second opening 25, and the third opening 26.

The emitter electrode 64 is formed on the first principal surface 3 of the semiconductor layer 2. The emitter electrode 64 enters the third opening 63 from above the insulating layer 21, and is electrically connected to the $n^+$-type emitter region 57 and to the $p^+$-type contact region 58 in the third opening 63. The collector electrode 65 is formed on the side of the second principal surface 4 of the semiconductor layer 2.

As described above, it is possible to likewise fulfill the same working effects as those described in the first preferred embodiment by employing a structure including the planar-gate type IGBT as in the semiconductor device 71. Of course, the structure of the semiconductor device 51 according to the second preferred embodiment may be applied to the semiconductor device 66.

A semiconductor device including the planar-gate type MISFET may be employed by forming the $n^+$-type drain region 67 instead of the $p^+$-type collector region 56 as in the fourth preferred embodiment. Likewise, in this structure, it is possible to fulfill the same working effects as those described in the first preferred embodiment.

Figure 12:
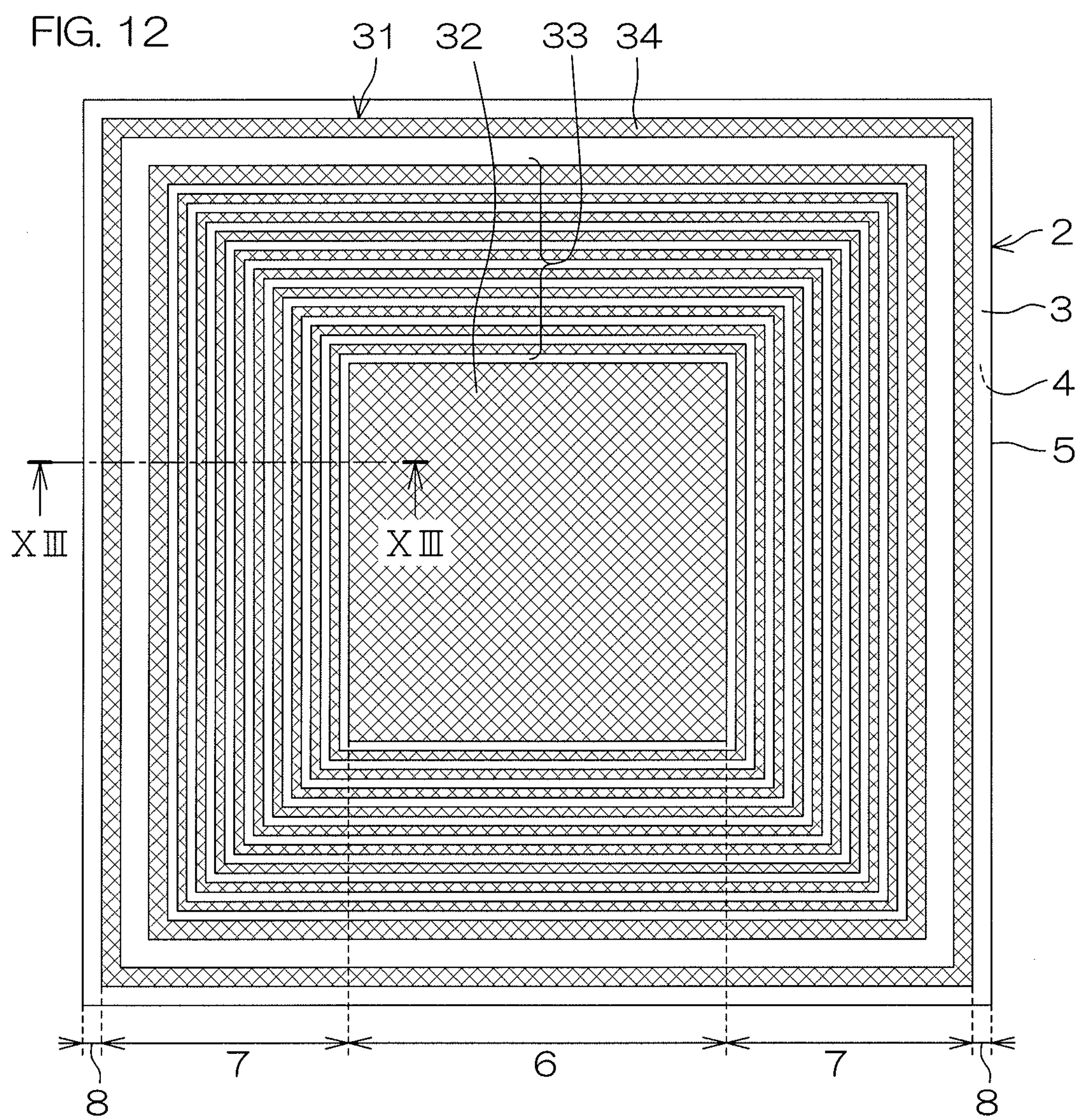
FIG. 12 is a schematic plan view of a semiconductor device according to a sixth preferred embodiment of the present invention.
Figure 13:
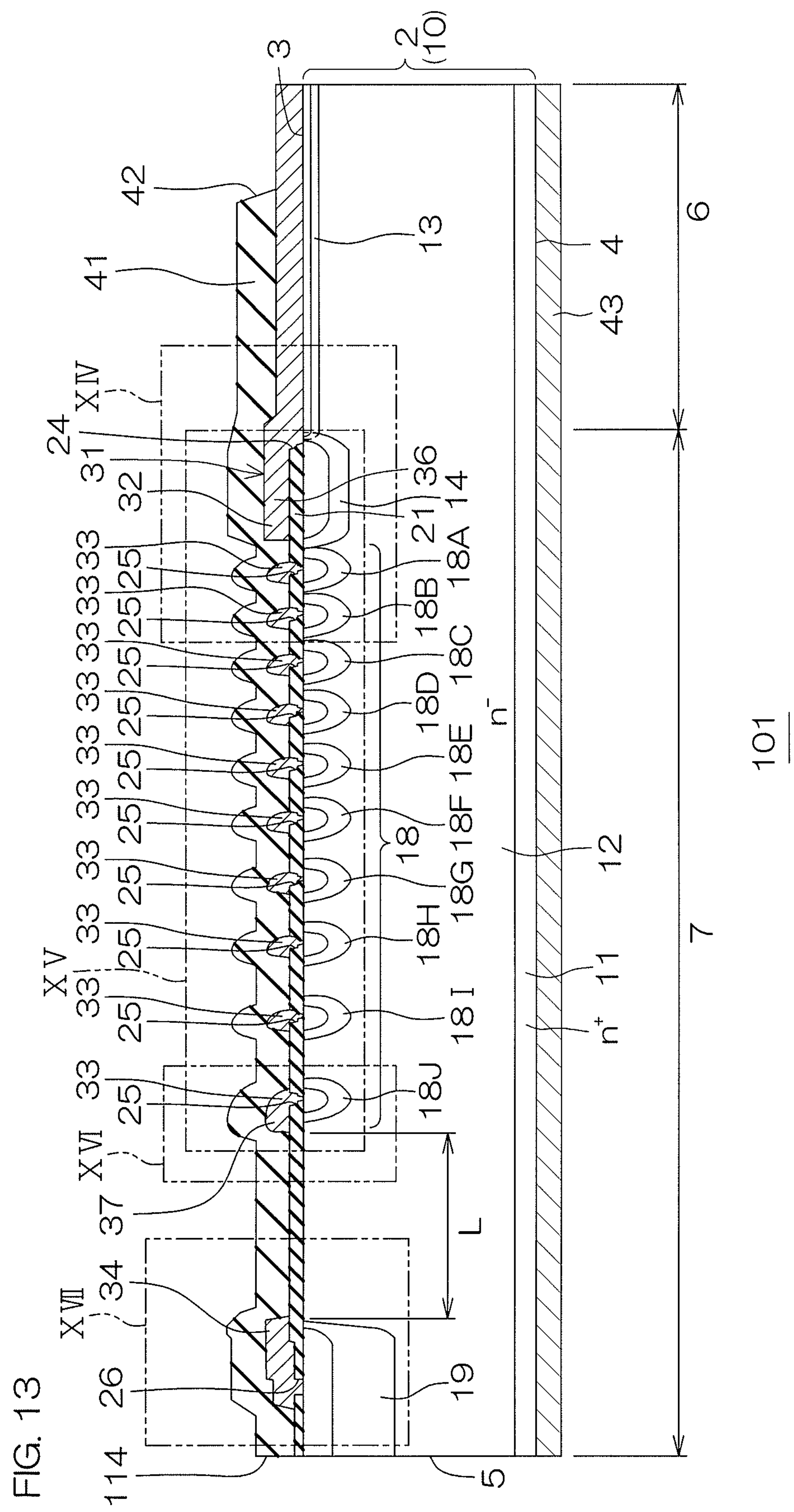
FIG. 13 is a cross-sectional view along line XIII-XIII of FIG. 12.
Figure 14:
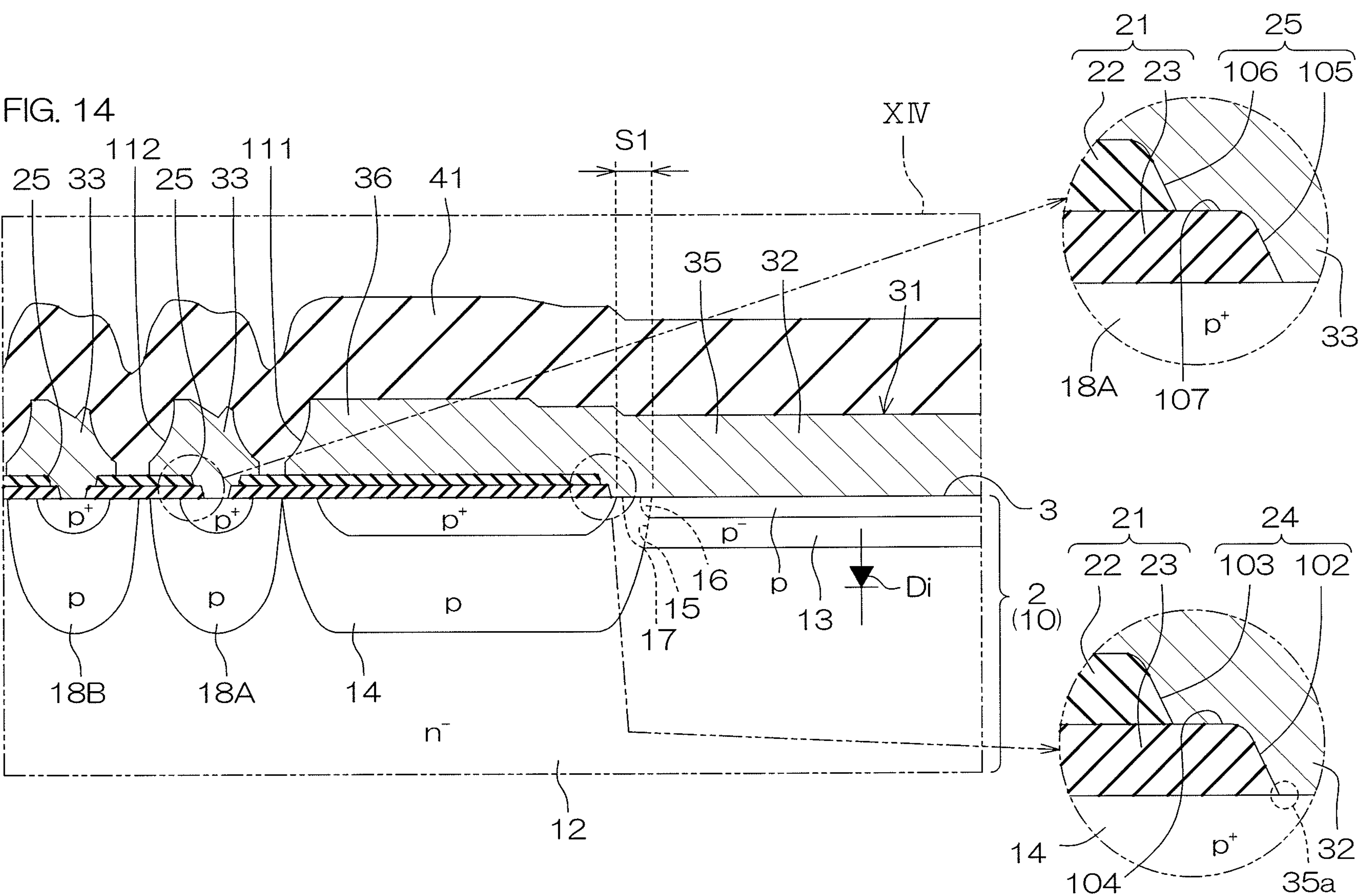
FIG. 14 is an enlarged view of region XIV of FIG. 12.
Figure 15:
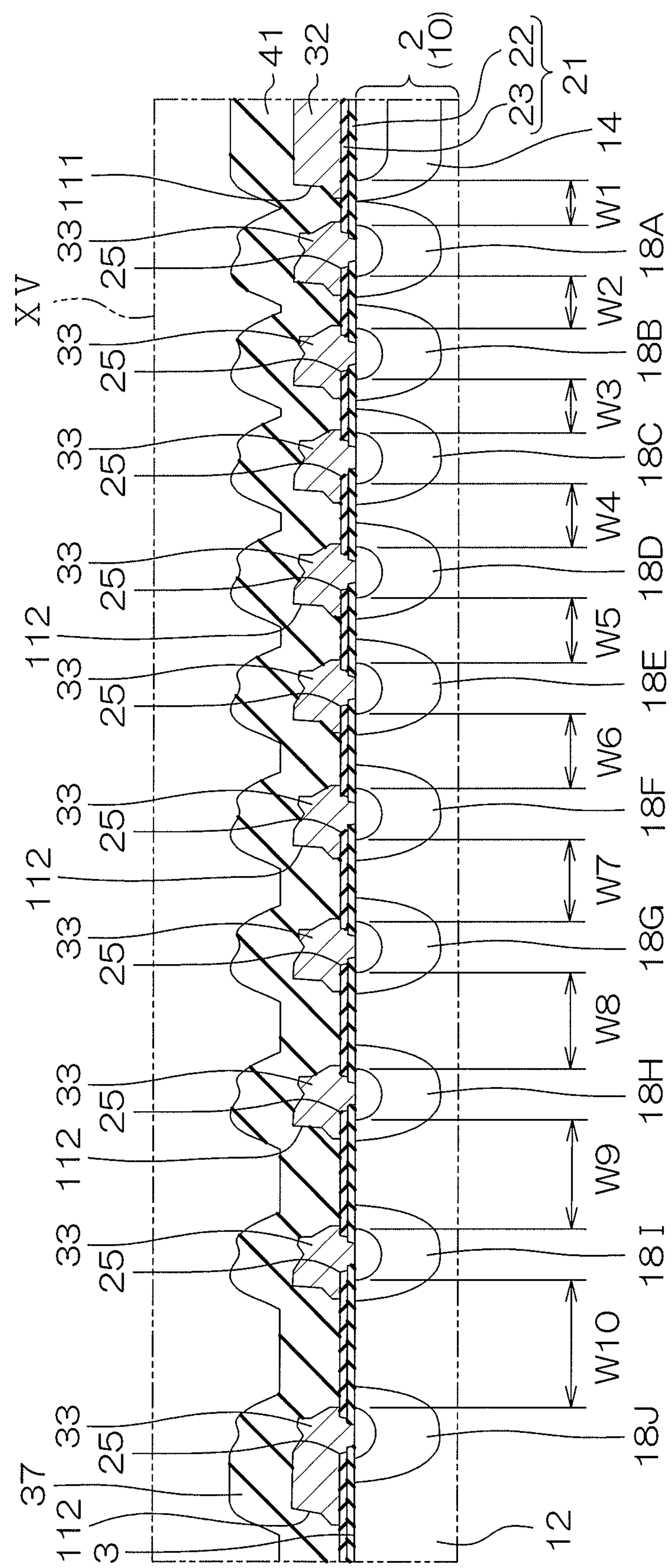
FIG. 15 is an enlarged view of region XV of FIG. 12.
Figure 16:
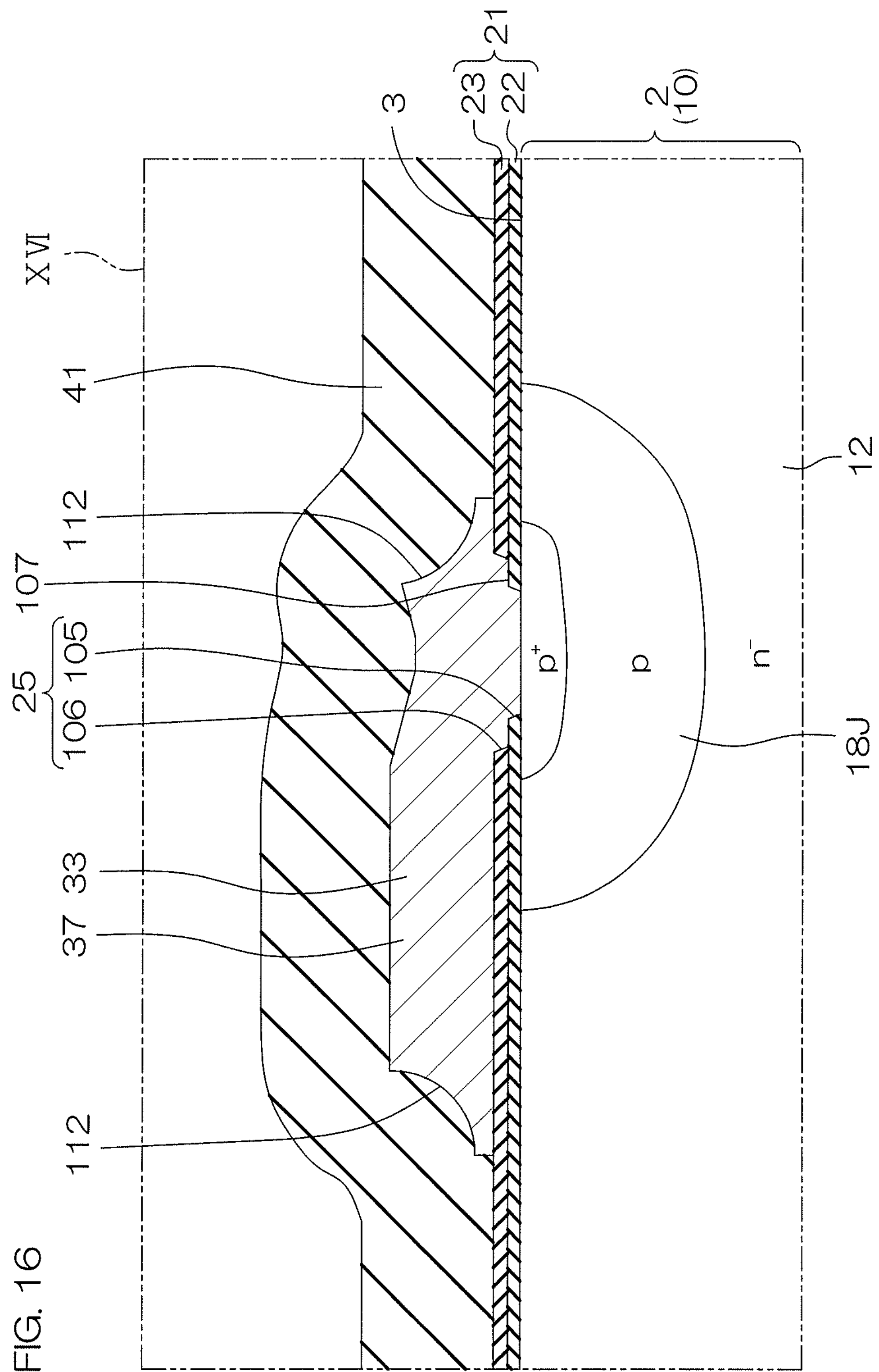
FIG. 16 is an enlarged view of region XVI of FIG. 12.
Figure 17:
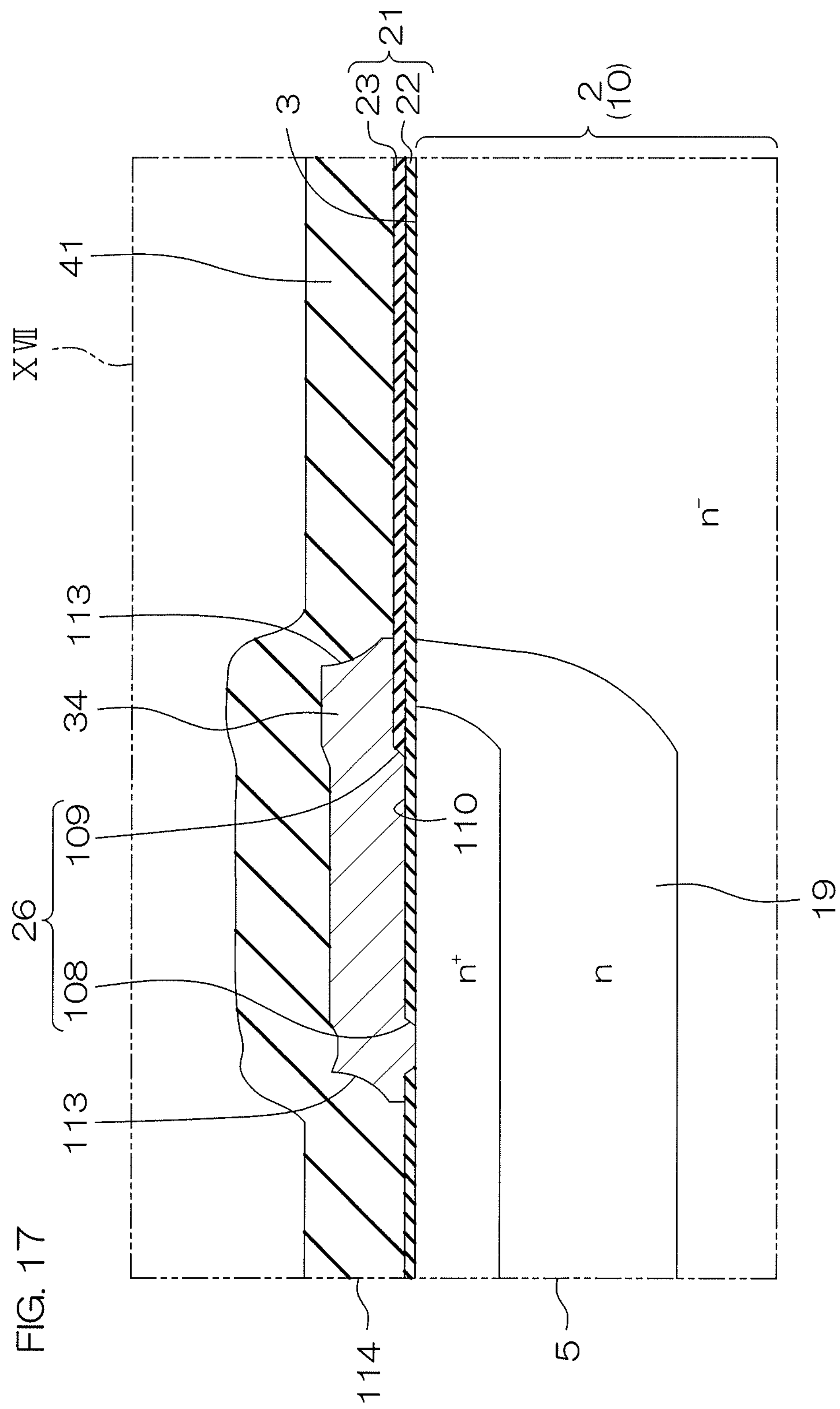
FIG. 17 is an enlarged view of region XVII of FIG. 12.

FIG. 12 is a schematic plan view of a semiconductor device 101 according to a sixth preferred embodiment of the present invention. FIG. 13 is a cross-sectional view along line XIII-XIII of FIG. 12. FIG. 14 is an enlarged view of region XIV of FIG. 12. FIG. 15 is an enlarged view of region XV of FIG. 12. FIG. 16 is an enlarged view of region XVI of FIG. 12. FIG. 17 is an enlarged view of region XVII of FIG. 12.

Hereinafter, the same reference sign is given to a structure equivalent to each structure of the semiconductor device 1, and a description thereof is omitted except when necessary.

The semiconductor device 101 is a diode device that includes a pn junction diode Di. Referring to FIG. 12, the semiconductor device 101 includes the semiconductor layer 2 formed in a chip-shape. The semiconductor layer 2 includes the device formation region 6 and the outer region 7. The semiconductor layer 2 is free from the scribe region 8 in the present preferred embodiment. The semiconductor layer 2 may include the scribe region 8.

Referring to FIG. 13 and FIG. 14, the p-type impurity region 13 is formed in the surface layer portion of the first principal surface 3 of the semiconductor layer 2 in the device formation region 6. The p-type impurity region 13 has a concentration profile in which the p-type impurity concentration of its surface layer portion is higher than that of its bottom portion. In FIG. 14, in the p-type impurity region 13, a part having a high p-type impurity concentration is represented by "p," and a part having a low p-type impurity concentration is represented by "$p^-$."

A pn junction diode Di is formed in which the p-type impurity region 13 serves as an anode and in which the semiconductor layer 2 serves as a cathode by a pn junction portion between the p-type impurity region 13 and the semiconductor layer 2. The pn junction diode Di may be a fast-recovery diode.

Referring to FIG. 13 and FIG. 14, the $p^+$-type terminal region 14 is formed in the surface layer portion of the first principal surface 3 of the semiconductor layer 2 in the outer region 7. The $p^+$-type terminal region 14 has a concentration profile in which the p-type impurity concentration of its surface layer portion is higher than that of its bottom portion. In FIG. 14, in the $p^+$-type terminal region 14, a part having a high p-type impurity concentration is represented by "$p^+$," and a part having a low p-type impurity concentration is represented by "p."

The depth of the $p^+$-type terminal region 14 may be 5 μm or more and 15 μm or less (for example, about 8 μm). The width of the $p^+$-type terminal region 14 may be 50 μm or more and 80 μm or less (for example, about 65 μm). The width of the $p^+$-type terminal region 14 may be defined by the width along a direction perpendicular to an arbitrary side surface 5 of the semiconductor layer 2.

Referring to FIG. 13 and FIG. 14, the p-type concentration reducing region 16 is formed in the boundary region 15 between the p-type impurity region 13 and the $p^+$-type terminal region 14 in the surface layer portion of the first principal surface 3 of the semiconductor layer 2. The structure of the p-type concentration reducing region 16 is the same as the structure of the p-type concentration reducing region 16 of the semiconductor device 1, and therefore a concrete description of the structure is omitted.

Referring to FIG. 13, FIG. 15, and FIG. 16, the $p^+$-type field limiting region group 18 is formed in the surface layer portion of the first principal surface 3 of the semiconductor layer 2 in the outer region 7.

The $p^+$-type field limiting region group 18 includes a plurality of (in the present preferred embodiment, ten) $p^+$-type field limiting regions 18A, 18B, 18C, 18D, 18E, 18F, 18G, 18H, 18I, and 18J (hereinafter, referred to simply as "$p^+$-type field limiting regions 18A to 18J"). The $p^+$-type field limiting regions 18A to 18J are formed in this order with intervals therebetween toward the side opposite to the p-type impurity region 13 with respect to the $p^+$-type terminal region 14.

The $p^+$-type field limiting regions 18A to 18J are each formed in an endless shape (for example, in a quadrangular annular shape) so as to surround the $p^+$-type terminal region 14 in the plan view. The $p^+$-type field limiting regions 18A to 18J are also called FLRs (Field Limiting Rings).

The $p^+$-type field limiting regions 18A to 18J each have a concentration profile in which the p-type impurity concentration of its surface layer portion is higher than that of its bottom portion. In FIG. 14, FIG. 16, and the like, in the $p^+$-type field limiting regions 18A to 18J, a part having a high p-type impurity concentration is represented by "$p^+$," and a part having a low p-type impurity concentration is represented by "p."

The depth of each of the $p^+$-type field limiting regions 18A to 18J may be 5 μm or more and 15 μm or less (for example, about 8 μm). The width of each of the $p^+$-type field limiting regions 18A to 18J may be 10 μm or more and 40 μm or less (for example, about 25 μm).

The distance W1 between the field limiting region 18A and the $p^+$-type terminal region 14 may be 14 μm or more and 16 μm or less (for example, about 15 μm). The distance W1 is measured on the basis of the distance between a highly-concentrated region of the field limiting region 18A and a highly-concentrated region of the $p^+$-type terminal region 14 in the present preferred embodiment.

The distances W2 to W10 between the mutually adjoining $p^+$-type field limiting regions 18B to 18J become greater in this order toward the side opposite to the p-type impurity region 13. The distances W2 to W10 are each measured on the basis of the distance between highly-concentrated regions of the $p^+$-type field limiting regions 18B to 18J in the present preferred embodiment.

The distance W2 may be 15 μm or more and 17 μm or less (for example, about 16 μm). The distance W3 may be 17 μm or more and 19 μm or less (for example, about 18 μm). The distance W4 may be 18 μm or more and 20 μm or less (for example, about 19 μm).

The distance W5 may be 20 μm or more and 22 μm or less (for example, about 21 μm). The distance W6 may be 22 μm or more and 24 μm or less (for example, about 23 μm). The distance W7 may be 25 μm or more and 27 μm or less (for example, about 26 μm).

The distance W8 may be 28 μm or more and 30 μm or less (for example, about 29 μm). The distance W9 may be 33 μm or more and 35 μm or less (for example, about 34 μm). The distance W10 may be 39 μm or more and 41 μm or less (for example, about 40 μm).

Referring to FIG. 13 and FIG. 17, the $n^+$-type channel stop region 19 is formed in the surface layer portion of the first principal surface 3 of the semiconductor layer 2 in the outer region 7. The $n^+$-type channel stop region 19 has a concentration profile in which the n type impurity concentration of its surface layer portion is higher than that of its bottom portion. In FIG. 17, in the $n^+$-type channel stop region 19, a part having a high n type impurity concentration is represented by "$n^+$," and a part having a low n type impurity concentration is represented by "n."

The $n^+$-type channel stop region 19 is exposed from the side surface 5 of the semiconductor layer 2. The width of the $n^+$-type channel stop region 19 may be 80 μm or more and 110 μm or less (for example, about 95 μm). The width of the $n^+$-type channel stop region 19 may be defined by the width along a direction perpendicular to an arbitrary side surface 5 of the semiconductor layer 2.

Referring to FIG. 13 to FIG. 17, the insulating layer 21 is formed on the first principal surface 3 of the semiconductor layer 2.

The insulating layer 21 has a layered structure including the first insulating film 22 and the second insulating film 23 that are laminated together in this order from the semiconductor-layer-2 side. The first insulating film 22 may include $SiO_2$. The second insulating film 23 may include PSG (Phosphosilicate Glass).

The thickness of the first insulating film 22 may be 0.5 μm or more and 5 μm or less (for example, about 1.5 μm). The thickness of the second insulating film 23 may be 0.5 μm or more and 5 μm or less (for example, about 1.5 μm).

The insulating layer 21 has the first opening 24, the plurality of (in the present preferred embodiment, ten) second openings 25, and the third opening 26. The first opening 24 exposes the p-type impurity region 13 and the $p^+$-type terminal region 14. The second openings 25 expose the $p^+$-type field limiting regions 18B to 18J, respectively. The third opening 26 exposes the $n^+$-type channel stop region 19.

Referring to FIG. 14, the first opening 24 is formed in a quadrangular shape having four sides respectively parallel to the sides of the semiconductor layer 2 in the plan view. The inner wall surface that defines the first opening 24 is positioned on the $p^+$-type terminal region 14. The first opening 24 exposes the inner peripheral region of the $p^+$-type terminal region 14 in addition to the whole area of the p-type impurity region 13.

More specifically, the first opening 24 includes a first opening portion 102 defined by an inner wall of the first insulating film 22 and a second opening portion 103 that is defined by an inner wall of the second insulating film 23 and that communicates with the first opening portion 102.

An inner wall surface of the first opening portion 102 of the first opening 24 is positioned on the $p^+$-type terminal region 14. An inner wall surface of the second opening portion 103 of the first opening 24 is positioned on the first insulating film 22. The second opening portion 103 of the first opening 24 has a plane area larger than that of the first opening portion 102.

Consequently, in the first opening 24, a stepped portion 104 that connects the inner wall surface of the first opening portion 102 and the inner wall surface of the second opening portion 103 together is formed between the first opening portion 102 and the second opening portion 103.

Referring to FIG. 15 and FIG. 16, the second openings 25 are formed along the $p^+$-type field limiting regions 18A to 18J, respectively. Each of the second openings 25 is formed in a quadrangular annular shape in the plan view.

An inner wall surface that defines each of the second openings 25 is positioned on a corresponding one of the $p^+$-type field limiting regions 18A to 18J. Each of the second openings 25 exposes the inner region of a corresponding one of the $p^+$-type field limiting regions 18A to 18J.

More specifically, each of the second opening 25 includes a first opening portion 105 defined by an inner wall of the first insulating film 22 and a second opening portion 106 that is defined by an inner wall of the second insulating film 23 and that communicates with the first opening portion 105.

An inner wall surface of the first opening portion 105 of each of the second openings 25 is positioned on a corresponding one of the $p^+$-type field limiting regions 18A to 18J. An inner wall surface of the second opening portion 106 of each of the second openings 25 is positioned on the first insulating film 22. The second opening portion 106 of each of the second openings 25 has a plane area larger than that of the first opening portion 105.

Consequently, in each of the second openings 25, a stepped portion 107 that connects the inner wall surface of the first opening portion 105 and the inner wall surface of the second opening portion 106 together is formed between the first opening portion 105 and the second opening portion 106.

The opening width of the first opening portion 105 of each of the second openings 25 may be 3.0 μm or more and 6.0 μm or less (for example, about 4.5 μm). The opening width of the second opening portion 106 of each of the second openings 25 may be 10.0 μm or more and 12.0 μm or less (for example, about 11.0 μm).

Referring to FIG. 17, the third opening 26 is formed along the $n^+$-type channel stop region 19. The third opening 26 is formed in a quadrangular annular shape in the plan view.

An inner wall surface that defines the third opening 26 is positioned on the $n^+$-type channel stop region 19. The third opening 26 exposes an inner region of the $n^+$-type channel stop region 19.

More specifically, the third opening 26 includes a first opening portion 108 defined by an inner wall of the first insulating film 22 and a second opening portion 109 that is defined by an inner wall of the second insulating film 23 and that communicates with the first opening portion 108.

An inner wall surface of the first opening portion 108 of the third opening 26 is positioned on the $n^+$-type channel stop region 19. The second opening portion 109 of the third opening 26 has a plane area larger than that of the first opening portion 108.

The second opening portion 109 of the third opening 26 communicates with the side surface 5 of the semiconductor layer 2 in the present preferred embodiment. An inner wall surface of the second opening portion 109 of the third opening 26 is positioned on the first insulating film 22.

Consequently, in the first opening 24, a stepped portion 110 that connects the inner wall surface of the first opening portion 108 and the inner wall surface of the second opening portion 109 together is formed between the first opening portion 108 and the second opening portion 103.

The opening width of the first opening portion 108 of the third opening 26 may be 3.0 μm or more and 7.0 μm or less (for example, about 5.0 μm). The opening width of the second opening portion 109 of the third opening 26 may be 60 μm or more and 100 μm or less (for example, about 80 μm). The opening width of the second opening portion 109 is also a distance from the side surface 5 of the semiconductor layer 2 to the inner wall surface of the second opening portion 109 in the present preferred embodiment.

Referring to FIG. 12 to FIG. 17, the electrode layer is formed on the first principal surface 3 of the semiconductor layer 2. In FIG. 12, the electrode layer 31 is shown in each part by hatching.

The electrode layer 31 may include at least one kind of aluminum, copper, an alloy including aluminum and an alloy including copper. The electrode layer 31 may include an AlSi alloy (aluminum silicon alloy) as an alloy including aluminum. The thickness of the electrode layer 31 may be 5 μm or more and 15 μm or less (for example, about 8 μm).

The electrode layer 31 includes the anode electrode 32, the plurality of (in the present preferred embodiment, ten) field plates 33, and the equipotential electrode 34. The anode electrode 32 is formed in a quadrangular shape having four sides respectively parallel to the sides of the semiconductor layer 2 in the plan view. The anode electrode 32 is electrically connected to the p-type impurity region 13 and to the $p^+$-type terminal region 14.

A cutout portion 111 that is hollowed from its upper surface toward the semiconductor-layer-2 side is formed at a peripheral edge of the anode electrode 32. The anode electrode 32 is formed in a tapered shape in a cross-sectional view by the cutout portion 111. The width of the cutout portion 111 may be 1 μm or more and 10 μm or less (for example, about 5 μm).

Referring to FIG. 14, the anode electrode 32 includes the connection portion 35 and the drawn portion 36 as in the semiconductor device 1. The drawn portion 36 of the anode electrode 32 is continuously drawn out onto the insulating layer 21 from the inside of the first opening 24 toward the side opposite to the p-type impurity region 13.

The drawn portion 36 of the anode electrode 32 is formed along the inner wall surface of the first opening portion 102 of the first opening 24 and along the inner wall surface of the second opening portion 103. The width of the drawn portion 36 of the anode electrode 32 may be 50 μm or more and 80 μm or less (for example, about 65 μm).

Referring to FIG. 15, the plurality of field plates 33 are formed along the $p^+$-type field limiting regions 18A to 18J, respectively, in the plan view. Each of the field plates 33 is formed in a quadrangular annular shape in the plan view.

Each of the field plates 33 enters a corresponding second opening 25 from above the insulating layer 21. Each of the field plates 33 is connected to a corresponding one of the $p^+$-type field limiting regions 18A to 18J in the corresponding second opening 25.

The widths of the field plates 33 respectively formed along the $p^+$-type field limiting regions 18A to 18I may be each 10 μm or more and 30 μm or less (for example, about 20 μm).

Referring to FIG. 15 and FIG. 16, the field plate 33 formed along the $p^+$-type field limiting region 18J includes the drawn portion 37, and is formed more widely than the other field plates 33. The drawn portion 37 is continuously drawn out onto the insulating layer 21 from the inside of the second opening 25 toward the side opposite to the p-type impurity region 13.

The total width of the field plate 33 including the drawn portion 37 may be 20 μm or more and 60 μm or less (for example, about 40 μm). The width of the drawn portion 37 may be 10 μm or more and 30 μm or less (for example, about 20 μm).

A cutout portion 112 that is hollowed from its upper surface toward the semiconductor-layer-2 side is formed inner and outer peripheral edges of each of the field plates 33. Each of the field plates 33 is formed in a tapered shape in a cross-sectional view by the cutout portion 112. The width of the cutout portion 112 may be 1 μm or more and 10 μm or less (for example, about 5 μm).

Referring to FIG. 17, the equipotential electrode 34 is formed along the $n^+$-type channel stop region 19 in the plan view. The equipotential electrode 34 is formed in a quadrangular annular shape in the plan view. The equipotential electrode 34 is also called an EQR (EQui-potential Ring) electrode.

The equipotential electrode 34 enters the third opening 26 from above the insulating layer 21. The equipotential electrode 34 is in contact with the inner wall surface of the first opening portion 108 of the third opening 26 and with the inner wall surface of the second opening portion 109. The equipotential electrode 34 is connected to the $n^+$-type channel stop region 19 in the third opening 26.

An outer peripheral edge of the equipotential electrode 34 is formed so as to have an interval from the side surface 5 of the semiconductor layer 2 toward the p-type impurity-region-13 side. A cutout portion 113 that is hollowed from its upper surface toward the semiconductor-layer-2 side is formed inner and outer peripheral edges of the equipotential electrode 34. The equipotential electrode 34 is formed in a tapered shape in a cross-sectional view by the cutout portion 113.

The width of the equipotential electrode 34 may be 60 μm or more and 100 μm or less (for example, about 80 μm). The width of the cutout portion 113 may be 1 μm or more and 10 μm or less (for example, about 5 μm). The distance between the outer peripheral edge of the equipotential electrode 34 and the side surface 5 of the semiconductor layer 2 may be 15 μm or more and 40 μm or less (for example, about 25 μm).

The surface protection film 41 is formed on the insulating layer 21 along a front surface of the electrode layer 31. The surface protection film 41 coats the device formation region 6 and the outer region 7 in the present preferred embodiment. The surface protection film 41 has a side surface 114 formed so as to be flush with the side surface 5 of the semiconductor layer 2. The side surface 5 of the semiconductor layer 2 and the side surface 114 of the surface protection film 41 are formed by ground surfaces, respectively.

The pad opening 42 by which a partial region of the anode electrode 32 is exposed as an anode pad is formed in the surface protection film 41. The cathode electrode 43 serving as a back-surface electrode is connected to the second principal surface 4 of the semiconductor layer 2. The cathode electrode 43 coats the second principal surface 4 of the semiconductor layer 2, and is connected to the $n^+$-type highly-concentrated region 11.

As described above, the semiconductor device 101 makes it possible to likewise fulfill the same working effects as those described with respect to the semiconductor device 1.

The structure according to one preferred embodiment selected from among the second to fifth preferred embodiments may be applied to the semiconductor device 101. Additionally, a structure obtained by a combination of structures according to a plurality of preferred embodiments selected from among the second to fifth preferred embodiments may be applied to the semiconductor device 101.

The present invention can be embodied in still other modes although the preferred embodiments of the present invention have been described.

In each of the aforementioned preferred embodiments, the insulating layer 21 may be formed according to the following methods. First, an insulating material is deposited on the first principal surface 3 of the semiconductor layer 2 according to, for example, a CVD method. An insulating layer serving as a base for the insulating layer 21 is thereby formed. Thereafter, an unnecessary part of the insulating layer is selectively removed by, for example, photolithography and etching. The insulating layer 21 having the first opening 24, the second opening 25, and the third opening 26 is thereby formed.

In each of the aforementioned preferred embodiments, the first insulating film 22 may include SiN in addition to or instead of $SiO_2$. The second insulating film 23 may include SiN in addition to or instead of PSG.

In each of the aforementioned preferred embodiments, the insulating layer 21 may have a single-layer structure including only either one of the first insulating film 22 and the second insulating film 23. If the insulating layer 21 has a single-layer structure, the insulating layer 21 may be a LOCOS (Local Oxidation of Silicon) film formed by selectively oxidizing the first principal surface 3 of the semiconductor layer 2.

In each of the aforementioned preferred embodiments, the insulating layer 21 may have a trench isolation structure. The trench isolation structure may have a structure in which an insulator is embedded in a trench formed by digging down the surface layer portion of the first principal surface 3 of the semiconductor layer 2.

The insulator embedded in the trench may be the first insulating film 22 and/or the second insulating film 23. The trench isolation structure may be called an STI (Shallow Trench Isolation) structure or a DTI (Deep Trench Isolation) structure or the like in accordance with the depth of the trench.

In the aforementioned second preferred embodiment, the coating portion 52 of the insulating layer 21 may be a bird's beak portion of the insulating layer 21. The bird's beak portion may have a structure in which the thickness of a part positioned on the p-type impurity-region-13 side is smaller than the thickness of a part positioned on the $p^+$-type terminal-region-14 side. If the insulating layer 21 has the bird's beak portion, the insulating layer 21 may have a single-layer structure made of a single insulating material.

In each of the aforementioned preferred embodiments, although it is preferable that the $p^+$-type field limiting region group 18 is formed, a structure in which a single $p^+$-type field limiting region is formed may be employed instead of the $p^+$-type field limiting region group 18.

In each of the aforementioned preferred embodiments, an arrangement in which the conductivity type of each semiconductor part is reversed may be employed. In other words, a p-type part may be set as an n type, whereas an n type part may be set as a p-type.

The present application corresponds to Japanese Patent Application No. 2016-219800 filed in the Japan Patent Office on Nov. 10, 2016 and to Japanese Patent Application No. 2017-202112 filed in the Japan Patent Office on Oct. 18, 2017, and the entire disclosure of the application is incorporated herein by reference.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. A semiconductor device comprising:

a semiconductor layer;

a drift layer of a first conductivity type forming a surface layer portion of the semiconductor layer;

an impurity region of a second conductivity type formed in a surface layer portion of the drift layer;

a terminal region of the second conductivity type that is formed in the surface layer portion of the drift layer along a peripheral edge of the impurity region and that has a second conductivity type impurity concentration higher than a second conductivity type impurity concentration of the impurity region;

a connection region formed in a region in which the peripheral edge of the impurity region and the terminal region are connected;

a plurality of field limiting regions of the second conductivity type that are formed in the surface layer portion of the drift layer at intervals in a direction away from the terminal region, and that are formed such that distances between adjacent pairs of the field limiting regions become greater as distances from the terminal region become greater;

an insulating layer that is formed on the semiconductor layer, and that has a first opening exposing the impurity region, the terminal region, and the connection region, and has a plurality of second openings each exposing the corresponding ones of the field limiting regions at intervals in the direction away from the terminal region;

a surface electrode that has a connection portion connected to the impurity region, to the terminal region, and to the connection region inside the first opening of the insulating layer, and that has a drawn portion drawn out onto the insulating layer from the connection portion through the first opening and formed at an interval from the innermost field limiting region to the impurity region side as viewed in plan;

a plurality of field electrodes that are formed on the insulating layer at intervals from the surface electrode and that are connected to the corresponding ones of the field limiting regions inside the corresponding second openings, respectively; and an organic insulating layer formed on the insulating layer so as to cover the drawn portion of the surface electrode and the plurality of field electrodes;

wherein the insulating layer has a plurality of thin film portions covering peripheral portions of the corresponding ones of the field limiting regions, and a plurality of thick film portions covering regions between adjacent pairs of the field limiting regions such as to protrude upward relative to the thin film portions, the first opening of the insulating layer is defined by an inclined surface having an acute angle with respect to the semiconductor layer inside the insulating layer, the drawn portion of the surface electrode is drawn out onto the insulating layer through the inclined surface of the first opening from the connection portion, and faces the terminal region across the inclined surface of the first opening, the organic insulating layer is drawn out onto the connection portion of the surface electrode from on the drawn portion of the surface electrode, faces the impurity region, the terminal region and the connection region across the connection portion of the surface electrode, and partially exposes the connection portion of the surface electrode, the impurity region has the second conductivity type impurity concentration of 1.0×1016 cm-3 or more and 1.0×1017 cm 3 or less, the terminal region has the second conductivity type impurity concentration of 1.0×1017 cm-3 or more 5.0×1017 cm-3 or less, and a concentration ratio of the impurity region with respect to the terminal region is 0.225 or more and 1.0 or less.

2. The semiconductor device according to claim 1, further comprising:

a channel stop region of the first conductivity type that is formed in the surface layer portion of the drift layer at an interval from the outermost field limit region in the direction away from the terminal region, and that has a first conductivity type impurity concentration higher than a first conductivity type impurity concentration of the drift region.

3. The semiconductor device according to claim 2, wherein the channel stop region is exposed from a side surface of the semiconductor layer.

4. The semiconductor device according to claim 2, further comprising:

an equipotential electrode that is formed on the insulating layer at an interval from the outermost field electrode and is electrically connected to the channel stop region.

5. The semiconductor device according to claim 4, wherein the insulating layer has a third opening exposing the channel stop region at an interval from the outermost second opening, and the equipotential electrode is connected to the channel stop region inside the third opening.

6. The semiconductor device according to claim 1, wherein the terminal region surrounds the impurity region as viewed in plan.

7. The semiconductor device according to claim 1, wherein a bottom portion of the terminal region is formed at a position deeper than a bottom portion of the impurity region in a thickness direction of the semiconductor layer.

8. The semiconductor device according to claim 1, wherein the terminal region overlaps with the impurity region.

9. The semiconductor device according to claim 1, wherein a connection size of the connection portion of the surface electrode with respect to the terminal region is 30 μm or more and not more than a width of the terminal region.

10. The semiconductor device according to claim 1, wherein a connection size of the connection portion of the surface electrode with respect to the terminal region is 60 μm or more and not more than a width of the terminal region.

11. The semiconductor device according to claim 1, wherein the impurity region and the drift layer form a pn junction diode.

12. The semiconductor device according to claim 11, wherein the pn junction diode is a fast-recovery diode.

13. The semiconductor device according to claim 1, further comprising:

an emitter region of the first conductivity type that is formed in the surface layer portion of the impurity region and defines a channel region of an IGBT with the drift layer, in the impurity region;

a collector region of the second conductivity type formed in the semiconductor layer so as to face a bottom portion of the impurity region with a partial region of the drift layer interposed therebetween; and a gate electrode facing the channel region with a gate insulating film interposed therebetween.

14. The semiconductor device according to claim 1, further comprising:

an source region of the first conductivity type that is formed in the surface layer portion of the impurity region and defines a channel region of a MISFET with the drift layer, in the impurity region;

a drain region of the first conductivity type formed in the semiconductor layer so as to face a bottom portion of the impurity region with a partial region of the drift layer interposed therebetween; and a gate electrode facing the channel region with a gate insulating film interposed therebetween.

15. The semiconductor device according to claim 1, wherein the semiconductor layer has a single layer structure formed of a semiconductor substrate by which the drift layer is formed.

16. The semiconductor device according to claim 1, wherein the semiconductor layer has a laminated structure including a semiconductor substrate and an epitaxial layer formed on the semiconductor substrate as the drift layer.

17. The semiconductor device according to claim 1, wherein each of the plurality of second openings has a first opening portion defined by the thin film portions such as to expose an inner portion of the corresponding field limiting region, and a second opening portion defined by the thick film portions such as to expose the corresponding first opening portion.

18. The semiconductor device according to claim 17, wherein the insulating layer has a plurality of step portions each formed between corresponding ones of the first and second opening portions.

* * * * *